United States Patent
Okada

(10) Patent No.: US 7,645,681 B2
(45) Date of Patent: Jan. 12, 2010

(54) BONDING METHOD, DEVICE PRODUCED BY THIS METHOD, AND BONDING DEVICE

(75) Inventor: Masuaki Okada, Osaka (JP)

(73) Assignee: Bondtech, Inc., Kyoto (JP)

( * ) Notice: Subject to any disclaimer, the term of this patent is extended or adjusted under 35 U.S.C. 154(b) by 329 days.

(21) Appl. No.: 10/581,430

(22) PCT Filed: Dec. 2, 2004

(86) PCT No.: PCT/JP2004/017930

§ 371 (c)(1),
(2), (4) Date: Jun. 2, 2006

(87) PCT Pub. No.: WO2005/054147

PCT Pub. Date: Jun. 16, 2005

(65) Prior Publication Data

US 2007/0111471 A1    May 17, 2007

(30) Foreign Application Priority Data

Dec. 2, 2003    (JP) .............................. 2003-402527

(51) Int. Cl.
*H01L 21/30* (2006.01)
(52) U.S. Cl. ............................... 438/455; 257/E21.122
(58) Field of Classification Search ................. 438/455; 257/E21.122
See application file for complete search history.

(56) References Cited

U.S. PATENT DOCUMENTS

| | | | | |
|---|---|---|---|---|
| 5,383,993 A | * | 1/1995 | Katada et al. ................ | 156/153 |
| 5,421,953 A | * | 6/1995 | Nagakubo et al. ............. | 216/34 |
| 6,291,314 B1 | * | 9/2001 | Henley et al. ................ | 438/458 |
| 6,321,134 B1 | * | 11/2001 | Henley et al. ................ | 700/121 |
| 6,645,828 B1 | * | 11/2003 | Farrens et al. ................ | 438/455 |
| 2004/0169020 A1 | | 9/2004 | Yamauchi | |
| 2005/0101059 A1 | * | 5/2005 | Yang .......................... | 438/127 |
| 2009/0026587 A1 | * | 1/2009 | Angyal et al. ................ | 257/632 |

FOREIGN PATENT DOCUMENTS

| | | |
|---|---|---|
| JP | 54-124853 | 9/1979 |
| JP | 10-259039 A | 9/1998 |
| JP | 11-192712 A | 7/1999 |
| JP | 2003-318217 | 11/2003 |
| WO | WO 03/001858 | 6/2002 |

* cited by examiner

*Primary Examiner*—Trung Dang
(74) *Attorney, Agent, or Firm*—Vedder Price P.C.; Ajay A. Jagtiani

(57) ABSTRACT

Conventional heat bonding and anodic bonding require heating at high temperature and for a long time, leading to poor production efficiency and occurrence of a warp due to a difference in thermal expansion, resulting in a defective device. Such a problem is solved. An upper wafer 7 made of glass and a lower wafer 8 made of Si are surface-activated using an energy wave before performing anodic bonding, thereby performing bonding at low temperature and increasing a bonding strength. In addition, preliminary bonding due to surface activation is performed before main bonding due to anodic bonding is performed in a separate step or device, thereby increasing production efficiency, and enabling bonding of a three-layer structure without occurrence of a warp.

22 Claims, 10 Drawing Sheets

F I G. 7
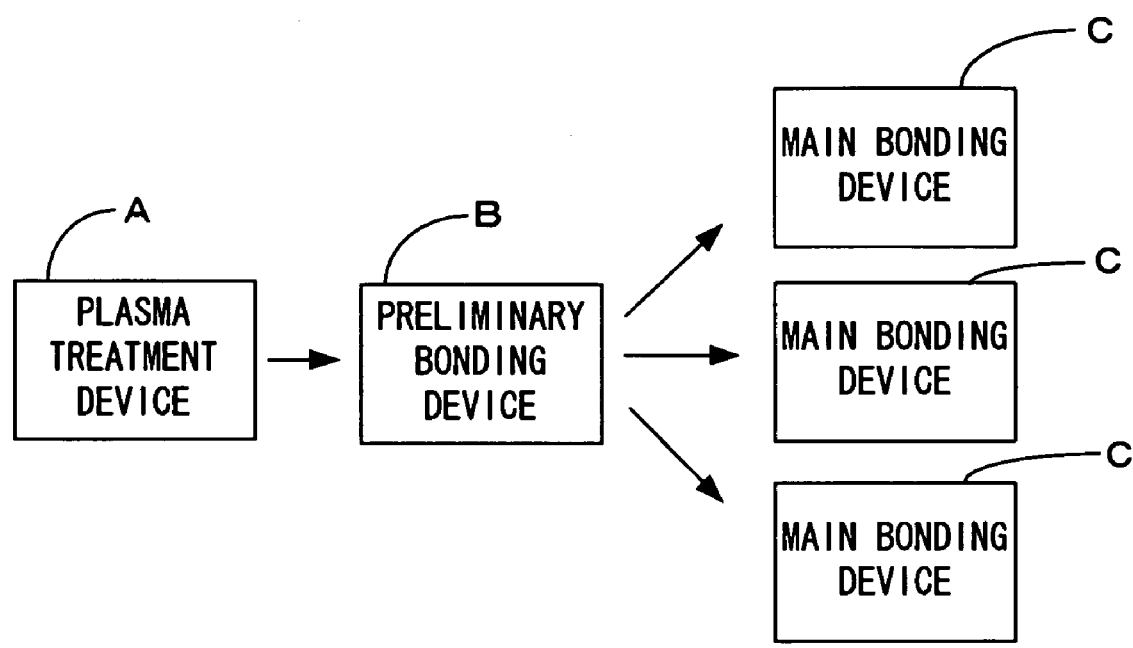

BONDING METHOD, DEVICE PRODUCED BY THIS METHOD, AND BONDING DEVICE

TECHNICAL FIELD

The present invention relates to a technique of attaching a plurality of objects to be bonded (wafers, etc.) together by anodic bonding.

BACKGROUND ART

Conventionally, there is a known method for bonding a wafer made of Si and a wafer made of glass together by applying a voltage using a electrode for the glass wafer as a cathode while both the wafers are contacted with each other and heating to as high as about 400° C. to 500° C. (anodic bonding). In the conventional technique, the wafers are transported in the atmospheric air, so that organic substances unavoidably adhere to surfaces of the wafers. The strength is as weak as 3 MPa at 200° C. as illustrated in FIG. 5, and therefore, the strength is increased to about 9 MPa by heating at a high temperature of about 400° C. In other words, conventional anodic bonding requires high-temperature heating as well.

Patent Document 1 discloses an exemplary room-temperature bonding method of etching metals using an Ar ion beam and bonding the surface-activated metals together at room temperature. In this method, however, organic substances or oxide film is removed from a surface to prepare a surface which is electrically activated with metal dangling bond so that bonding is performed due to an atomic force, and therefore, firm bond cannot be achieved for Si (semiconductor), and particularly glass and $SiO_2$, which are oxide materials.

When objects to be bonded are arranged facing each other and are subjected to a plasma treatment as disclosed in Patent Document 2, a electrode for one of the objects to be bonded inevitably serves as a plasma electrode, so that reaction gas ions are accelerated and strike the object to be bonded on the plasma electrode. Therefore, this technique is suitable for physical etching which removes an organic substance layer, but not for a chemical treatment using OH groups or the like, because of being excessively strong thereto.

As an application in which anodic bonding is often used, a method of sealing from one or both sides is often used for high-frequency devices or MEMS devices as illustrated in FIG. 8.

Patent Document 1: JP S54-124853 A
Patent Document 2: JP 2003-318217 A

DISCLOSURE OF INVENTION

Problem to be Solved by the Invention

In conventional anodic bonding methods, organic substances readhere to a surface to at least some extent, so that an organic substance layer is sandwiched at interface to at least some extent during anodic bonding. Ordinarily, heating to about 200° C. at which glass is softened would allow anodic bonding in the presence of applied voltage to achieve firm bond, however, because of adhesion of the organic substance layer, a bonding strength is increased only after organic substances are decomposed by heating at a high temperature of about 400° C. to 500° C. Also, since bonding is not performed in a vacuum, air voids are sandwiched. Also, in conventional methods, anodic bonding takes several hours, resulting in poor production efficiency. If preliminary bonding is performed using an adhesive or the like, foreign matter is sandwiched between Si and glass, so that anodic bonding cannot be performed. Particularly for MEMS devices and the like, in which bonding is performed after high-precision positioning, production efficiency is poor.

In the case of the room-temperature bonding method disclosed in Patent Document 1, since organic substances or oxide film is removed from a surface to prepare an electrically-activated surface of a metal or a semiconductor so that bonding is performed due to an atomic force, firm bond cannot be achieved for Si semiconductor and particularly oxides such as glass and $SiO_2$, which are not metals. Also, because of room temperature, softening is not performed, so that a gap in which bonding cannot be performed or a residual stress is left due to dust (minute particles) or surface unevenness (wave-like form), resulting in occurrence of a portion having an insufficient bonding strength. Therefore, it is necessary to remove the residual stress by annealing which requires several hours even at low temperature. Also, it is necessary to press with high pressure to bury the gaps and achieve tight attachment of the wave-like form or the gaps, i.e., it is necessary to use a considerably high pressure of 300 MPa or more as well.

When objects to be bonded are arranged facing each other and are subjected to a plasma treatment as indicated in Patent Document 2, one of the objects to be bonded inevitably serves as a plasma electrode, so that reaction gas ions are accelerated and strike the plasma electrode. Therefore, this technique is suitable for physical etching which removes an organic substance layer, but not for surface activation by a chemical treatment using OH groups or the like, because of being excessively strong thereto. As described above, there is not a method which satisfies both cleaning and adsorbing.

In the method of sealing a high-frequency device or an MEMS device from one or both sides thereof (FIGS. 8A and 8B), one or both sides of Si are sealed with glass using anodic bonding, which is an exemplary structure using the materials which are generally often used. However, even in the case of the three-layer structure, anodic bonding is successively performed from one side, so that a difference in coefficient of linear expansion between Si and glass causes a warp due to heating during bonding as illustrated in FIG. 9A, and in the worst case, a break occurs.

Therefore, an object of the present invention is to provide a bonding method and a bonding device in which bonding surfaces of objects to be bonded are subjected to a surface activation treatment using an energy wave, such as an atom beam, an ion beam or a plasma, followed by subjecting both the objects to be bonded to anodic bonding at low temperature. Another object of the present invention is to provide a method and a bonding device in which a step or a device for performing preliminary bonding at room temperature, and a step or a device for performing main bonding while heating, are separated from each other.

MEANS FOR SOLVING PROBLEM

Hereinafter, a bonding method and a bonding device according to the present invention so as to solve the above-described problems will be collectively described.

To solve the problems, the present invention provides a bonding method for performing anodic bonding of objects to be bonded after subjecting bonding surfaces of both the objects to be bonded to a surface activation treatment using an energy wave, such as an atom beam, an ion beam, or a plasma (claim 1).

The present invention also provides a bonding device comprising an anodic bonding means for performing anodic bonding of objects to be bonded after subjecting bonding surfaces of both the objects to be bonded to a surface activation treatment using an energy wave, such as an atom beam, an ion beam, or a plasma, and the anodic bonding means has a voltage applying means and a heating means (claim 19).

The anodic bonding refers to a method for applying a voltage between both the objects to be bonded which are contacted with each other, and tightly attaching bonding interfaces together due to an electrostatic force between materials into which an element which is decomposed into a movable ion due to an applied voltage is introduced and mixed, followed by heating, to soften and tightly attaching at least one of the materials, thereby achieving covalent bond. The surface activation treatment using an energy wave refers to a treatment which activates a bonding interface using an atom beam, an ion beam or a plasma so as to facilitate bonding.

A principle of bonding due to surface activation can be considered as follows. In the case of a material, such as a metal, adhering substances, such as organic substances, oxide film or the like, are removed by etching from a surface to generate an active dangling bond of a metal atom on the surface, whereby the other dangling bonds are bonded together. Also, if the objects to be bonded are made of Si or an oxide including glass, $SiO_2$ or ceramics, the bonding surfaces are activated using OH groups by a hydrophilic treatment using an oxygen or nitrogen plasma, and the other OH groups are bonded together. Regarding the plasma, an atmospheric-pressure plasma which can be used under the atmospheric pressure can be easily handled as well as a low-pressure plasma. According to the present invention, anodic bonding is performed after surface activation using an energy wave in accordance with the bonding principle, thereby performing bonding at lower temperature and increasing the bonding strength. Also, after performing preliminary bonding due to surface activation, main bonding due to the anodic bonding is performed in a separate step or device, thereby increasing production efficiency and enabling bonding of a three-layer structure without occurrence of a warp.

Note that an environment in which surface activation and anodic bonding are performed is not particularly limited, and may be in a vacuum or in the atmospheric air, which are encompassed by the present invention. The present invention encompasses a situation where the surface activating unit is separated from the bonding device.

Note that the present invention may also provide a bonding method in which the bonding surfaces are in a shape which allows them to tightly attach each other, one or more particles are present on the bonding surface, and anodic bonding is performed. Alternatively, the present invention may also provide a bonding device in which the bonding surfaces are in a shape which allows them to tightly attach each other, one or more particles are present on the bonding surface, and anodic bonding is performed.

Even when a minute particle is sandwiched as described above, anodic bonding can perform bonding without a gap due to softening of glass by heating or tight attachment due to an electrostatic force. The present invention also provides a method in which anodic bonding is performed using a pressing force of 300 Mpa or less during the main bonding. The present invention also provides a device comprising pressing means for applying a pressing force of 300 Mpa or less, in which anodic bonding is performed. Bonding can be performed using 300 Mpa or less (e.g., 100 Mpa) due to heating and an electrostatic force by anodic bonding, though, in the above-described room-temperature bonding, a pressing force of 300 Mpa or more is required since the material is not softened.

The present invention also provides the bonding method according to claim 1, wherein both the objects to be bonded are heated at less than 400° C. during or after bonding (claim 2).

The bonding device according to claim 19, wherein both the objects to be bonded are heated at less than 400° C. during or after bonding (claim 20).

Here, 200° C. or less is more preferable.

Regarding heating means, it is necessary and difficult to select a special heater so as to provide means for heating to 400° C. or more. As illustrated in FIG. 5, in the case of a conventional method in which glass and Si are subjected to anodic bonding after transportation in the atmospheric air, a bonding strength of as low as 3 MPa was obtained at 200° C. even when bonding is performed in a vacuum, and a strength of 9 MPa was able to be obtained only after the temperature was increased to as high as 400° C. This is because adhesion of organic substances occurs during transportation in the atmospheric air, so that the bonding surface includes an organic substance layer, and therefore, the bonding strength is not increased, and the bonding strength is increased only after the temperature is increased to as high as 400° C. so that the organic substances are decomposed.

On the other hand, when dry cleaning was performed by Ar etching in a vacuum and thereafter, without exposure to the atmospheric air, anodic bonding was performed in a vacuum, a bonding strength of 6 MPa was obtained even at room temperature, and 10 MPa was obtained at 200° C., i.e., a sufficient bonding strength which is larger than or equal to that which is conventionally obtained by heating at 400° C. It was found that, when the bonding strength obtained in a high vacuum after a treatment using an Ar ion beam was measured, the bonding strength was 5 MPa at room temperature and the bonding strength was not increased even by heating to 400° C. more than in the conventional art. Here, the bonding strength may take an about double value, depending on the measuring method, and is used as comparative data though it is relatively low strength data. A satisfactory bonding result was obtained at 200° C. or less using other surface activation methods of FIG. 6, as described hereinbelow.

The present invention also provides the bonding method according to claim 1 or 2, wherein, after the surface activation treatment, the anodic bonding of both the objects to be bonded is performed without exposure to the atmospheric air (claim 3).

The present invention also provides the bonding device according to claim 19 or 20, wherein an energy wave treatment means and the anodic bonding means are provided in a low-pressure chamber, and after the surface activation treatment, the anodic bonding of both the objects to be bonded is performed without exposure to the atmospheric air (claim 21).

A surface is etched with an energy wave to remove adhering substances and expose a newly generated surface of a base material. In this situation, following this, both the objects to be bonded are contacted with each other without exposure to the atmospheric air, a voltage is applied, and heating is performed, thereby performing anodic bonding. Therefore, adhesion of organic substances is avoided, and covalent bond (Si—O, etc.) is obtained where a bonding force is basically generated by an applied voltage. When one of the objects to be bonded is made of glass, a temperature is required at which heating softens glass to copy the other object to be bonded without a gap, i.e., about 200° C. is sufficient. If the objects to be bonded have a satisfactory flatness or planeness, softening is not required, and the bonding strength is increased to some extent even at room temperature.

The present invention also provides the bonding method according to claim 3, wherein the energy wave is a low-pressure plasma, and continuously after the surface activation treatment, the objects to be bonded are contacted with each other in a vacuum in the same chamber to perform the anodic bonding (claim 4).

The present invention also provides the bonding device according to claim 21, wherein the energy wave is a low-pressure plasma, plasma treatment means and the anodic bonding means are provided in the same low-pressure chamber, and continuously after the surface activation treatment, the objects to be bonded are contacted with each other in a vacuum in the same chamber to perform the anodic bonding (claim 22).

Separate chambers for a surface activation treatment using an energy wave and for performing anodic bonding, can be handled. However, for example, both the objects to be bonded are held in the same chamber, facing the upper and lower electrodes, and continuously after plasma etching using a reaction gas (Ar, etc), a plasma power supply is switched to an anodic bonding power supply, whereby the same electrodes can be used as they are, and only one chamber is required, resulting in a compact size and a reduction in cost. Also, a high vacuum is not required as compared to other energy waves. Also, since bonding is performed in a vacuum, voids can be prevented from being sandwiched.

The present invention may also provide a method and a device in which the plasma is generated using an alternating power supply. By using the alternating power supply, positive ions and negative electrons alternately strike the surface of the object to be bonded, so that neutralization occurs, resulting in less damage (charge-up damage, etc.) as compared to other energy waves. Therefore, this technique is suitable for semiconductors and devices.

The present invention also provides the bonding method according to any of claims 1 to 4, wherein an amount of etching using the energy wave is 1 nm or more (claim 5).

The present invention also provides the bonding device according to any of claims 19 to 22, wherein an amount of etching using the energy wave is 1 nm or more (claim 23).

Even when the object to be bonded is exposed to the atmospheric air after wet cleaning, adhering substances adhere to the surface of the object to be bonded to 1 nm or more within several seconds. Therefore, it is effective to etch by at least 1 nm or more.

The present invention also provides the bonding method according to claim 1 or 2, wherein, after performing preliminary bonding due to surface activation at room temperature, main bonding due to the anodic bonding is performed in a separate step or device (claim 6).

The present invention also provides the bonding device according to claim 19 or 20, wherein the device comprises an activating means for performing surface activation using an energy wave, and after performing preliminary bonding due to surface activation at room temperature, main bonding due to the anodic bonding is performed in a separate step or device (claim 24).

The room temperature refers to a temperature of 150° C. or less at which bonding can be achieved, which is lower than a low temperature (183° C.) at which a typical solder conventionally allows metal bonding. Room temperature is more preferable. There are conventional known bonding methods in which an adhesive is used, and diffusion bonding is performed by heating at high temperature. The adhesive allows preliminary bonding, but cannot be used for bonding of minute structures (MEMS, etc.) or electrical bonding (semiconductors, etc.). The adhesive also has many disadvantages, i.e., has a weak adhesive force, releases gas, absorbs moisture, and the like. Regarding the diffusion method, since it is performed at high temperature, a problem arises in heat resistance of materials, a warp occurs due to a difference in coefficient of linear expansion between different materials, and in the worst case, a break occurs.

However, these problems can be solved if bonding can be achieved at room temperature after a surface activation treatment using an energy wave. However, because of room temperature, unless residual stress or distortion due to surface roughness or wave-like form of a mass-production material is removed, the bonding strength is not increased. Although preliminary bonding can be easily performed at room temperature, main bonding requires annealing while heating for several hours to increase the bonding strength. Therefore, if these processes are performed in a single step or device, mass-production efficiency decreases. Therefore, the preliminary bonding step of attachment at room temperature and the main bonding step due to heating are separated and performed in separate devices, thereby making it possible to increase mass-production efficiency. As described above, the surface activation treatment refers to a treatment including removal of adhering substances by etching and a hydrophilic treatment. Particularly, for Si, glass, $SiO_2$ and ceramic, preferably, surface activation by etching can be used only for preliminary bonding, and is also suitable for a hydrophilic treatment.

The present invention also provides the bonding method according to claim 6, wherein a single of the preliminary bonding step is balanced with a plurality of the main bonding steps (claim 7).

The present invention also provides the bonding device according to claim 24, wherein a single step or device of performing the preliminary bonding is balanced with a plurality of steps or devices of performing the main bonding (claim 25).

A single step or device of performing preliminary bonding is balanced with a plurality of steps or devices of performing main bonding, i.e. the line balancing improves, thereby making it possible to further increase mass-production efficiency. For example, assuming that preliminary bonding takes 10 minutes and main bonding takes one hour, if six main bonding devices are prepared for one preliminary bonding device, bonding can be performed at a rate of one piece per 10 minutes. In terms of cost, as compared to when six preliminary-main bonding integrated devices are arranged, cost is overwhelmingly reduced when one preliminary bonding device and six main bonding devices which simply apply a voltage and heating are arranged.

The present invention also provides the bonding method according to claim 6 or 7, wherein three or more objects to be bonded are stacked and bonded together, and objects to be bonded having the same coefficient of linear expansion sandwich an object to be bonded having a different coefficient of linear expansion from both sides thereof (claim 8).

The present invention also provides the bonding device according to claim 24 or 25, wherein three or more objects to be bonded are stacked and anodic-bonded together, and objects to be bonded having the same coefficient of linear expansion sandwich an object to be bonded having a different coefficient of linear expansion from both sides thereof, and the device comprises a means for simultaneously applying a voltage from the middle member toward the members at both ends (claim 26).

As illustrated in FIGS. 8A and 8B, for high-frequency devices or MEMS devices, there are a method of sealing on one side (FIG. 8A) and a method of sealing on both sides (FIG. 8B). As illustrated in FIG. 9A, in the case of the method of sealing on one side, a warp occurs due to a difference in coefficient of linear expansion between two materials. On the other hand, as illustrated in FIG. 9B, if objects to be bonded having the same coefficient of linear expansion are used to sandwich an object to be bonded having a different coefficient of linear expansion from both sides thereof, followed by heating, an opposite force from both sides is used to cancel, whereby a warp does not occur.

However, in the conventional art, the objects to be bonded have to be heated and bonded one by one so as to achieve high attachment accuracy. Therefore, the object to be bonded is clamped with a jig for preliminary attachment without an adhesive, but the object to be bonded may be displaced or there may be no space for clamping. Therefore, if the method of performing preliminary bonding due to surface activation at room temperature is used, preliminary bonding of three or more members is performed at room temperature where members having the same coefficient of linear expansion sandwich from both sides as illustrated in FIG. 9B, thereby obtaining high position accuracy, and thereafter, main bonding is performed by heating, thereby making it possible to achieve high-accuracy bonding without a warp. By providing a plurality of main bonding devices with respect to a preliminary bonding device, production efficiency can be increased.

The present invention also provides the bonding method according to any of claims 6 to 8, wherein the preliminary bonding is performed in a low-pressure chamber under a low pressure or in a replacing gas, and the main bonding is performed in the atmospheric air (claim 9).

The present invention also provides the bonding device according to any of claims 24 to 26, wherein the device comprises a low-pressure chamber, and the preliminary bonding is performed in the low-pressure chamber under a low pressure or in a replacing gas, and the main bonding is performed in the atmospheric air (claim 27).

In the case of a device sealed in a vacuum or an inert gas as illustrated in FIGS. 8A and 8B, when preliminary bonding is performed in a low-pressure atmosphere or a gas replacing atmosphere in a low-pressure chamber, main bonding is not contaminated with the atmospheric air even if main bonding is performed in the atmospheric air, since sealing is achieved in the preliminary bonding state. Particularly, when bonding is performed due to a hydrophilic treatment, since water is present at interface, the sealing effect is high. Therefore, main bonding can be performed in the atmospheric air, resulting in a reduction in cost and an increase in efficiency.

The present invention also provides the bonding method according to any of claims 6 to 9, wherein the energy wave is a plasma (claim 10).

The present invention also provides the bonding device according to any of claims 24 to 27, wherein the energy wave is a plasma, and the device comprises a plasma treatment means (claim 28).

Also, if the energy wave is a low-pressure or atmospheric-pressure plasma, an easy degree of vacuum is required as compared to other energy waves, resulting in a reduction in cost. The atmospheric-pressure plasma is more easily handled. Note that, for some bonding materials, bonding cannot be achieved unless a low-pressure plasma treatment is performed, and therefore, the low-pressure and atmospheric-pressure plasmas are superior in terms of bonding.

The present invention also provides the bonding method according to claim 10, wherein the plasma is a low-pressure plasma, and continuously after the treatment, the objects to be bonded are contacted with each other in a vacuum in the same chamber to perform the preliminary bonding (claim 11).

The present invention also provides the bonding device according to claim 28, wherein the plasma is a low-pressure plasma, the device comprises a vacuum chamber capable of providing a low pressure, a plasma generating means and a plasma reaction gas supplying means, and continuously after the treatment, the objects to be bonded are contacted with each other in a vacuum in the same chamber to perform the preliminary bonding (claim 29).

Separate chambers for the low-pressure plasma treatment and for performing bonding, can be handled. However, as illustrated in FIGS. 1 and 11, both the objects to be bonded are held in the same chamber, facing the upper and lower electrodes, and continuously after the plasma treatment, preliminary bonding is performed, whereby only one chamber is required, resulting in a compact size and a reduction in cost. Also, since bonding is performed in a vacuum, voids can be prevented from being sandwiched. The present invention also provides a method in which the plasma is generated using an alternating power supply. The present invention also provides a bonding device in which the plasma is generated using an alternating power supply. By using the alternating power supply, positive ions and negative electrons alternately strike the surface of the object to be bonded, so that neutralization occurs, resulting in less damage (charge-up damage, etc.) as compared to other energy waves. Therefore, this technique is suitable for semiconductors and devices.

The present invention also provides the bonding method according to claim 10 or 11, wherein the bonding surfaces are subjected to a hydrophilic treatment using the plasma to perform the preliminary bonding (claim 12).

The present invention also provides the bonding device according to claim 28 or 29, wherein the bonding surfaces are subjected to a hydrophilic treatment using the plasma to perform the preliminary bonding (claim 30).

A bonding principle due to a hydrophilic treatment is illustrated in FIGS. 10A to 10C. As illustrated in FIG. 10A, OH groups are caused to adhere to a Si surface by a hydrophilic treatment using an oxygen plasma or the like. Next, as illustrated in FIG. 10B, both the objects to be bonded are contacted with each other, and preliminary bonding is performed due to hydrogen bond. Following this, as illustrated in FIG. 10C, $H_2O$ is released by heating, resulting in firm covalent bond, i.e., Si—O—Si. The method of performing bonding using a hydrophilic treatment using a plasma treatment is easy and effective for bonding of oxides including Si, glass, $SiO_2$, and ceramics.

OH groups are generated on each surface, and hydrogen bond is obtained by OH groups on both the surfaces, thereby making it possible to achieve preliminary bonding. Although firm main bonding requires heating for several hours after preliminary bonding, preliminary bonding is instantaneously completed. Also in the case of bonding with sealing (FIGS. 8A and B), water is present at interface due to the preliminary bonding having a hydrophilic treatment, resulting in excellent sealing capability. In the hydrophilic treatment, an oxygen plasma or a nitrogen plasma is generally used, so that bonding can be performed even in an atmospheric-pressure plasma. Firm bond requires somehow difficult conditions, but when only a preliminary bonding level is required, bonding due to a hydrophilic treatment is relatively easy and suitable for preliminary bonding.

The present invention also provides the bonding method according to claim 12, wherein, during or after the hydrophilic treatment using the plasma, the preliminary bonding is performed after introducing and mixing a gas containing $H_2O$ or H and OH groups (claim 13).

The present invention also provides the bonding device according to claim 30, wherein the device comprises a water gas generating means, and during or after the hydrophilic treatment using the plasma, the preliminary bonding is performed after introducing and mixing a gas containing $H_2O$ or H and OH groups (claim 31).

A gas containing $H_2O$ or H and OH groups is also called a water gas. Typically, when a treatment is performed using an oxygen plasma and transportation is performed in the atmospheric air, since the atmospheric air contains moisture, OH groups are naturally generated. However, when treatments are performed in a vacuum without exposure to the atmospheric air until preliminary bonding in order to avoid adhesion of impurities and organic substances, moisture may be insufficient so that a sufficient number of OH groups are not generated. Therefore, it is effective to supply a gas containing $H_2O$ or H and OH groups during the oxygen plasma treatment or until bonding after the treatment. Although a water gas can be directly supplied, it is more effective to mix a water gas into oxygen, or activate a water gas by subjecting it as a reaction gas to a plasma treatment continuously after the oxygen plasma treatment.

The present invention also provides the bonding method according to claim 12 or 13, wherein, in the hydrophilic treatment using the plasma, a physical treatment using an increased ion strike force is performed and thereafter, without exposure to the atmospheric air, a chemical treatment using a reduced ion strike force is performed (claim 14).

The present invention also provides the bonding device according to claim 30 or 31, wherein the device comprises a low-pressure plasma treatment means for changing an ion strike force with respect to the objects to be bonded, and in the hydrophilic treatment using the plasma, a physical treatment using an increased ion strike force is performed and thereafter, without exposure to the atmospheric air, a chemical treatment using a reduced ion strike force is performed (claim 32).

Regarding the cleaning step using a plasma treatment, by performing a plasma treatment using a reduced ion strike force in a second half of the plasma treatment, a hydrophilic treatment is satisfactorily performed. Impurities are removed by a physical treatment in a typical plasma treatment, and attachment and arrangement of OH groups and replacement with nitrogen or the like are performed on a surface using a chemical treatment, however, the OH groups caused by the chemical treatment of the surface are unfortunately removed due to the strong ion strike force, thereby making it difficult to uniformly perform the chemical treatment on the surface.

Therefore, in the second half of the plasma treatment, the ion strike force is reduced to perform a plasma treatment. In this case, there are a number of ions or radicals which are not accelerated, whereby a chemical reaction is promoted and the chemical treatment is uniformly performed on the bonding surface, thereby making it possible to perform a surface activation treatment. Therefore, the bonding strength can be increased at low temperature, and also, preliminary bonding can be easily performed. The second half of the plasma treatment is not limited to half of a time and has a meaning which does not relate to time. There may be an interval between the first and second halves of the plasma treatment, but it is preferable in terms of the chemical treatment that they be continuous.

The present invention also provides the bonding method according to claim 14, wherein the physical treatment is performed using an Ar or $CF_4$ plasma (claim 15).

The present invention also provides the bonding method according to claim 14, wherein the chemical treatment is performed using an oxygen or nitrogen plasma (claim 16).

The present invention also provides the bonding device according to claim 32, wherein the physical treatment is performed using an Ar or $CF_4$ plasma (claim 33).

The present invention also provides the bonding device according to claim 32, wherein the chemical treatment is performed using an oxygen or nitrogen plasma (claim 34).

A surface is etched with an energy wave to remove adhering substances and expose a newly generated surface of a base material. In this situation, without exposure to the atmospheric air, the surface is subjected to a hydrophilic treatment using an oxygen plasma, thereby making it possible to perform the hydrophilic treatment without an organic substance layer. Therefore, since there is no stripping off of an organic substance layer having a weak strength after bonding due to a hydrogen bonding force or a weak strength after annealing, a sufficient bonding strength can be obtained only by annealing at low temperature for releasing $H_2O$ after achieving hydrogen bond and without diffusion. As illustrated in FIG. 6, in the case of a conventional method in which bonding is performed using an oxygen plasma treatment after transportation in the atmospheric air, the bonding strength is 3 MPa at room temperature, 6 MPa at 200° C., and 9 MPa at 400° C. This is because adhesion of organic substances occurs during transportation in the atmospheric air, so that a bonding surface containing an organic substance layer is included and therefore the bonding strength is not increased, and therefore, the strength is increased only by diffusion. The physical treatment refers to a phenomenon in which a surface layer is etched, and a phenomenon in which ion molecules strike the surface layer and replace surface molecules or adhere to a surface. The physical treatment is, for example, an act of etching an adhering layer with Ar ions of an Ar plasma, or replacement of the surface layer with oxygen ions or adhesion of oxygen ions to the surface a layer in the case of an oxygen plasma. The chemical treatment refers to a phenomenon in which the surface layer is treated by a chemical reaction due to an active radical, or an active ion having a reduced ion strike force.

However, if dry cleaning is performed by Ar etching in a vacuum, followed by a hydrophilic treatment using an oxygen plasma without exposure to the atmospheric air, a bonding strength is 5 MPa even at room temperature, and 8 MPa at 200° C. Thus, a sufficient bonding strength was able to be obtained. It was found that, when the bonding strength was measured in a high vacuum after a treatment using an Ar ion beam, the bonding strength was 5 MPa at room temperature and the bonding strength was not increased even by heating to 400° C. more than in the conventional art. If inert Ar is used as the plasma employed in the physical treatment, any material is not affected, and since the atomic weight of Ar is large, the etching force is preferably great. When an object to be bonded is made of Si, $SiO_2$, glass or ceramic, the material can be efficiently etched by using $CF_4$ as the plasma reaction gas. As the plasma used in the chemical treatment, oxygen is preferably used since adhesion of OH groups is facilitated. Also, when nitrogen is used, adhesion of OH groups can be similarly achieved.

An amount etched using the energy wave is preferably 1 nm or more in the method and the device. Even when the object to be bonded is exposed to the atmospheric air after wet cleaning, adhering substances adhere to the surface of the object to be bonded to 1 nm or more within several seconds. Therefore, it is effective to etch by at least 1 nm or more.

Note that the present invention may also provide a bonding method and a bonding device in which a plasma treatment means for changing the ion strike force is provided, and the ion strike force is reduced in the second half of the plasma treatment so that the chemical treatment is promoted.

Regarding the hydrophilic treatment using the plasma treatment, by performing a plasma treatment using a reduced ion strike force in the second half of the plasma treatment, impurities are removed by a physical treatment in a typical plasma treatment, and attachment and arrangement of OH groups and replacement with nitrogen or the like are performed on a surface using a chemical treatment, however, adhering substances caused by the chemical treatment of the surface are unfortunately removed due to a strong ion strike force, thereby making it difficult to uniformly perform the chemical treatment on the surface.

Therefore, in the second half of the plasma treatment, the ion strike force is reduced to perform a plasma treatment. In this case, there are a number of ions or radicals which are not accelerated, whereby a chemical reaction is promoted and the chemical treatment is uniformly performed on the bonding surface, thereby making it possible to perform a surface activation treatment. Therefore, the bonding strength can be increased at low temperature. Regarding the low temperature, bonding can be preferably achieved at a temperature of 400° C. or less, as compared to 400° C. or more required in the conventional art.

Note that a bonding method and a surface activating unit in which the bonding temperature is 200° C. or less may be provided. As illustrated in FIG. 5, more preferably, bonding can be achieved at 200° C. The second half of the plasma treatment is not limited to half of a time and has a meaning which does not relate to time. There may be an interval between the first and second halves of the plasma treatment, but it is preferable in terms of the chemical treatment that they be continuous. Particularly, the physical treatment refers to etching for removing impurities as a pretreatment for adhesion of OH groups, but here, in the step of adhesion of OH groups, to changing the ion strike force to cause adhesion of oxygen using the physical treatment, and accelerating adhesion of OH groups using the chemical treatment, aiming efficient adhesion of OH groups.

The present invention may also provide a bonding method and a bonding device in which the plasma treatment means for changing the ion strike force is a low-pressure plasma, the plasma treatment means comprises a plasma electrode including an object-to-be-bonded holding electrode and a counter surface electrode which are provided at two positions and can be switched, and a power supply is applied to the object-to-be-bonded holding electrode to perform a plasma treatment, and thereafter, a power supply is applied to the counter surface electrode to reduce the ion strike force, thereby performing a plasma treatment for promoting the chemical treatment.

On the plasma electrode side, since electric field is generated, ions are accelerated to strike, thereby increasing an ion strike force. On the counter surface facing the electrode, ions are not accelerated to strike, so that the ion strike force is low, but there are a number of ions or radicals which are not accelerated, so that a chemical reaction is promoted. A plasma electrode is provided which includes an object-to-be-bonded holding electrode and a counter surface electrode which are provided at two positions and can be switched. A power supply is applied to the object-to-be-bonded holding electrode to perform a plasma treatment, and thereafter, a power supply is applied to the counter surface electrode to reduce the ion strike force, thereby performing a plasma treatment. Thereby, impurities are removed and there are a number of ions or radicals which are not accelerated, due to a reduced ion strike force, a chemical reaction is promoted, thereby making it possible to uniformly perform surface activation of a bonding surface. Therefore, it is possible to increase a bonding strength at low temperature.

A difference in temperature and bonding strength between when a plasma power supply is applied only to an object-to-be-bonded holding electrode as in the conventional art, and when a process of switching between an object-to-be-bonded holding electrode and a counter surface electrode, is illustrated in FIG. 6. Although 400° C. is required to obtain a sufficient strength in the conventional art, this technique was able to achieve a sufficient bonding strength at room temperature to 200° C. or less, i.e., lower than or equal to 400° C. The counter electrode may be opposed like a parallel plate type, or may be provided at a surrounding position other than the electrode and, in this case, a similar effect is obtained. In order to avoid readhesion of an electrode material due to sputtering etching, a side surface is more preferable than the counter surface. As used herein, the counter surface electrode may be provided at these surrounding positions.

The present invention may also provide a bonding method and a bonding device, in which the plasma treatment means for changing the ion strike force is a low-pressure plasma, the plasma treatment means comprises an RF plasma power supply capable of adjusting Vdc, and a Vdc value is changed in the second half of the plasma treatment to reduce the ion strike force so that a plasma treatment for promoting the chemical treatment is performed.

On the plasma electrode side, electric field is generated, and a speed of striking ions varies depending on the Vdc value. For example, the larger the negative value of Vdc, the more + oxygen ions are accelerated, so that the ion strike force is increased. As the negative value of Vdc approaches zero, the speed becomes slower, so that the ion strike force is reduced. In this case, there are a number of ions or radicals which are not accelerated, so that a chemical reaction is promoted. When a plasma treatment is performed by setting the Vdc value to be a large negative value, and thereafter, the Vdc value is caused to approach zero to perform an adsorption step, so that a plasma treatment using a reduced ion strike force is performed in the second half of the plasma treatment, impurities are removed and there are a number of ions or radicals which are not accelerated, due to the reduced ion strike force, thereby making it possible to promote a chemical reaction to uniformly perform surface activation with respect to a bonding surface. Therefore, the bonding strength can be increased at low temperature. The result of bonding similar to that of FIG. 6 was obtained.

The present invention may also provide a bonding method and a bonding device in which the plasma treatment means for changing the ion strike force is a low-pressure plasma; the plasma treatment means comprises a pulsed-wave plasma power supply capable of adjusting a pulse width, and the pulse width is changed in the second half of the plasma treatment to reduce the ion strike force so that a plasma treatment for promoting the chemical treatment is performed.

On the plasma electrode side, electric field is generated, and by adjusting the pulse width, a time interval of − electric field in which + ions strike and a time interval of weak − electric field in which the strike is reduced can be adjusted. When the time of − electric field is increased, the strike of + ions is enhanced. When the time of − electric field is decreased, the strike of + ions is reduced.

For example, the longer the time of − electric field, the more the + oxygen ions are accelerated, so that the ion strike force is increased. The shorter the time of − electric field, the slower the speed, so that the ion strike force is decreased. In this case, there are a number of ions or radicals which are not accelerated, resulting in promotion of a chemical reaction. A plasma treatment is performed while the time of − electric field is increased by adjusting the pulse width, and thereafter, a plasma treatment is performed while the time of − electric field is decreased, so that, after a low-pressure plasma treatment in which the ion strike force is increased, a plasma treatment using a reduced ion strike force is performed, so that impurities are removed and there are a number of ions or radicals which are not accelerated, due to the reduced ion strike force, thereby making it possible to promote a chemical reaction to uniformly perform surface activation with respect to a bonding surface. Therefore, the bonding strength can be increased at low temperature. The result of bonding similar to that of FIG. 6 was obtained.

Note that a bonding method and a bonding device may be provided in which, after the treatment step, bonding surfaces of a plurality of objects to be bonded are tightly attached and bonded together in the atmospheric air. In this case, by reducing the ion strike force in the second half of the plasma treatment, a chemical reaction is promoted, thereby making it possible to uniformly performing a surface activation treatment with respect to the bonding surface. Since a chemical treatment, such as attachment of OH groups, replacement with nitrogen, or the like, is already performed with respect to the bonding surface, bonding can be achieved even in the atmospheric air.

Also, a bonding method and a bonding device may be provided in which, after the treatment step, bonding surfaces of a plurality of objects to be bonded are tightly attached and bonded together in a low pressure. Even when the pressure is once put back to the atmospheric pressure so that an adsorption layer is attached, by reducing the pressure in the vacuum chamber and tightly attaching and bonding both the objects to be bonded together, it is preferably possible to bond the objects to be bonded in a voidless manner without leaving the air at bonding interface.

The present invention may also provide a bonding method and a bonding device in which the plasma treatment means for changing the ion strike force is means for switching between two low-pressure plasma emitting means, the first plasma emitting means applies a power supply to the object-to-be-bonded holding electrode to perform the plasma treatment, and in the second half of the plasma treatment, the first plasma emitting means is switched to the second plasma emitting means which traps plasma ions generated in another room and emits radicals, thereby reducing the ion strike force so that a plasma treatment for promoting the chemical treatment is performed.

As illustrated in FIG. 12, while a wafer (object to be bonded) 503 is held by an object-to-be-bonded holding electrode (plasma power supply), an RF plasma power supply 501 is initially applied to perform a physical treatment in which ions strike the object to be bonded. Following this, the object to be bonded is irradiated with a larger number of radicals 504 generated by an upper surface wave plasma through an ion trapping plate 502 in a down-flow manner. Ions 505 are captured by the ion trapping plate 502, so that a larger number of radicals 504 can be emitted, thereby promoting a chemical treatment. Note that, in FIG. 12, 500 indicates a surface wave plasma generating means, 506 indicates a vacuum chamber, 507 indicates a reaction gas supply inlet, 508 indicates a gas discharge outlet, 509 indicates an object-to-be-bonded holding electrode, 510 indicates a microwave power supply, 511 indicates a surface wave plasma generating region, and 512 indicates an RF plasma generating region.

The present invention may also provide a bonding method and a bonding device in which the plasma treatment means for changing the ion strike force is means for switching between a low-pressure plasma and an atmospheric-pressure plasma, after the surfaces of the objects to be bonded are treated with an ion strike force enhanced by the low-pressure plasma, the ion strike force is reduced with the atmospheric-pressure plasma so that a plasma treatment for promoting the chemical treatment is performed.

When the plasma treatment is divided into a low-pressure plasma and an atmospheric-pressure plasma, in the low-pressure plasma treatment impurities are removed using a physical treatment, and attachment and arrangement of OH groups and replacement with nitrogen or the like are performed on a surface using a chemical treatment, however, adhering substances caused by the chemical treatment of the surface are unfortunately removed due to a strong ion strike force, thereby making it difficult to uniformly perform the chemical treatment on the surface.

Therefore, an atmospheric-pressure plasma treatment is performed after the low-pressure plasma treatment. Thereby, since ions are not accelerated in electric field in the case of the atmospheric-pressure plasma unlike in a vacuum, the ion strike force is weak, so that there are a number of ions or radicals which are not accelerated, thereby making it possible to promote a chemical reaction to uniformly perform surface activation with respect to a bonding surface. Therefore, the bonding strength can be increased at low temperature. Regarding the low temperature, bonding can be preferably achieved at a temperature of 400° C. or less, as compared to 400° C. or more required in the conventional art. Note that a bonding method and a bonding device may be provided in which the bonding temperature is 200° C. or less. As illustrated in FIG. 6, more preferably, bonding can be achieved at 200° C. or less.

Note that the present invention may also provide a bonding method and a bonding device in which the reaction gas is a gas mixture containing oxygen and nitrogen.

By using a gas containing nitrogen, a group containing O and N as well as an OH group are generated in the chemical treatment using the reduced ion strike force. Thereby, a chemical compound of Si, O and N is generated at interface during bonding, so that firm bond can be achieved even at room temperature. FIG. 6 illustrates comparison between when only an oxygen reaction gas was used and when a reaction gas containing oxygen and nitrogen was used. When only oxygen is used, firm bond is not achieved unless heating is performed to about 200° C. When oxygen and nitrogen are mixed, firm bond can be achieved even at room temperature to 100° C. or less.

Note that a bonding method and a bonding device may be provided in which a different gas or a different gas mixture is used as the plasma reaction gas in the second half of the plasma treatment. By using a different gas or a different gas mixture in the second half of the plasma treatment, the gas suitable for the chemical treatment can be preferably used. For example, an Ar gas is used in the first half of the plasma treatment and an oxygen gas is used in the second half, thereby making it possible to achieve an efficient plasma treatment. Alternatively, an oxygen gas can be used in the first half and nitrogen gas can be used in the second half. Instead of simply using different gases, a gas mixture of Ar and oxygen may be used, i.e., a larger amount of Ar may be mixed in the first half and a larger amount of oxygen may be mixed in the second half. When a gas mixture of oxygen and nitrogen is used, a larger amount of oxygen may be mixed in the first half and a larger amount of nitrogen may be mixed in the second half The present invention may also provide a bonding method and a bonding device in which the plasma reaction gas is switched from a reaction gas containing oxygen to a reaction gas containing nitrogen during a plasma treatment using a reduced ion strike force.

In the chemical treatment using the reduced ion strike force, by using a gas containing nitrogen, a group containing O and N as well as an OH group are generated. Also, since OH groups adhere to some extent in the first half of the plasma treatment, the OH group is replaced with N in the chemical treatment using the reduced ion strike force. Thereby, a chemical compound of Si, O and N is generated at interface during bonding, so that firm bond can be achieved even at room temperature. With this technique, a satisfactory result similar to FIG. 6 was obtained.

Note that a bonding method and a bonding device may be provided in which bonding is performed in a solid phase at a heating temperature of 100° C. or less. Also, a bonding method and a bonding device may be provided in which bonding is performed in a solid phase at a heating temperature which is room temperature.

If only OH groups excluding water molecules are efficiently arranged, bonding can be achieved at 100° C. or less. If a chemical treatment is performed using a reaction gas containing nitrogen in the second half of the plasma treatment, bonding can be preferably achieved at room temperature. Also, a bonding method and a bonding apparatus may be provided in which an adsorption step of exposure to a gas containing water molecules or hydrogen under the atmospheric pressure is performed after the treatment step and before the bonding step. By exposure to a gas containing water molecules or hydrogen under the atmospheric pressure after the treatment step, water molecules or hydrogen are easily adsorbed to the bonding surface, so that OH groups are arranged, thereby easily achieving hydrogen bond, as compared to a low-pressure plasma containing less water molecules or hydrogen.

The present invention also provides the bonding method according to any of claims 1 to 16, wherein at least one of the objects to be bonded is made of Si or an oxide including glass, $SiO_2$ and ceramics (claim 17).

The present invention also provides the bonding device according to any of claims 19 to 34, wherein at least one of the objects to be bonded is made of Si or an oxide including glass, $SiO_2$ and ceramics (claim 35).

As described as a conventional technique, the surface activation method using Ar ion etching is a technique capable of achieving bonding at low temperature. However, since organic substances or oxide film is removed from a surface to create an electronically activated metal surface and bonding is achieved due to an atomic force, the conventional technique is not suitable for firm main bonding of semiconductors or particularly oxides other than metals, but is suitable for preliminary bonding. Therefore, the present invention is suitable for semiconductors (Si, not metal), and particularly, $SiO_2$, glass and ceramic which include oxides since preliminary bonding and main bonding (anodic bonding) at room temperature easily generate covalent bond (Si—O, etc.) and also increase a bonding strength. In the case of bonding of Si objects, whereas a high vacuum state having $10^{-8}$ Torr is required in room-temperature bonding, this technique can be preferably easily handled at a vacuum degree of about $10^{-2}$ Torr. A particularly preferable combination is a combination of Si and glass since main bonding due to anodic bonding easily generates covalent bond (Si—O, etc.) and also increase a bonding strength. Also, preferably, this is preferable for bonding due to a hydrophilic treatment.

The present invention also provides a device, such as a semiconductor device, an MEMS device or the like, which is produced using the bonding method according to any of claims 1 to 17 and in which the object to be bonded is a wafer or a chip cut off from the wafer (claim 18).

This technique is particularly suitable since Si is used as a base material in semiconductors. It is also effective for sealing or bonding of a semiconductor and a package since glass, ceramic or $SiO_2$, which are insulator, is frequently used. Specifically, attachment by handling on a wafer during a semiconductor production process is most effective, and is also suitable for a chip state after dicing.

The technique enables low-temperature bonding, and therefore, is suitable for semiconductor devices susceptible to heat since ions are stripped off by heating at high temperature after ion implantation. In the case of MEMS devices, in which different materials are stacked, distortion conventionally occurs due to high-temperature heating during bonding. Therefore, in the case of an actuator, malfunction occurs. However, this technique enables low-temperature bonding, so that distortion due to heat is preferably suppressed. In the case of a pressure sensor or the like, conventionally, glass and Si are bonded together, so that distortion due to high-temperature heating during bonding affects the reliability of the device. Since this technique enables low-temperature bonding, it is preferably possible to produce an MEMS device having high reliability.

EFFECTS OF THE INVENTION

An effect of the present invention is that anodic bonding is performed after surface activation using an energy wave, thereby performing bonding at lower temperature and increasing a bonding strength, and also, after performing preliminary bonding due to surface activation, main bonding due to the anodic bonding is performed in a separate step or device, thereby increasing production efficiency and enabling bonding of a three-layer structure without occurrence of a warp.

In addition, both objects to be bonded are provided facing each other in the same vacuum chamber, thereby making it possible to perform all treatments in a single chamber.

BRIEF DESCRIPTION OF DRAWINGS

FIG. 7 is a diagram illustrating an efficient configuration of a preliminary bonding device and a main bonding device.

DESCRIPTION OF REFERENCE NUMERALS

Figure 1:
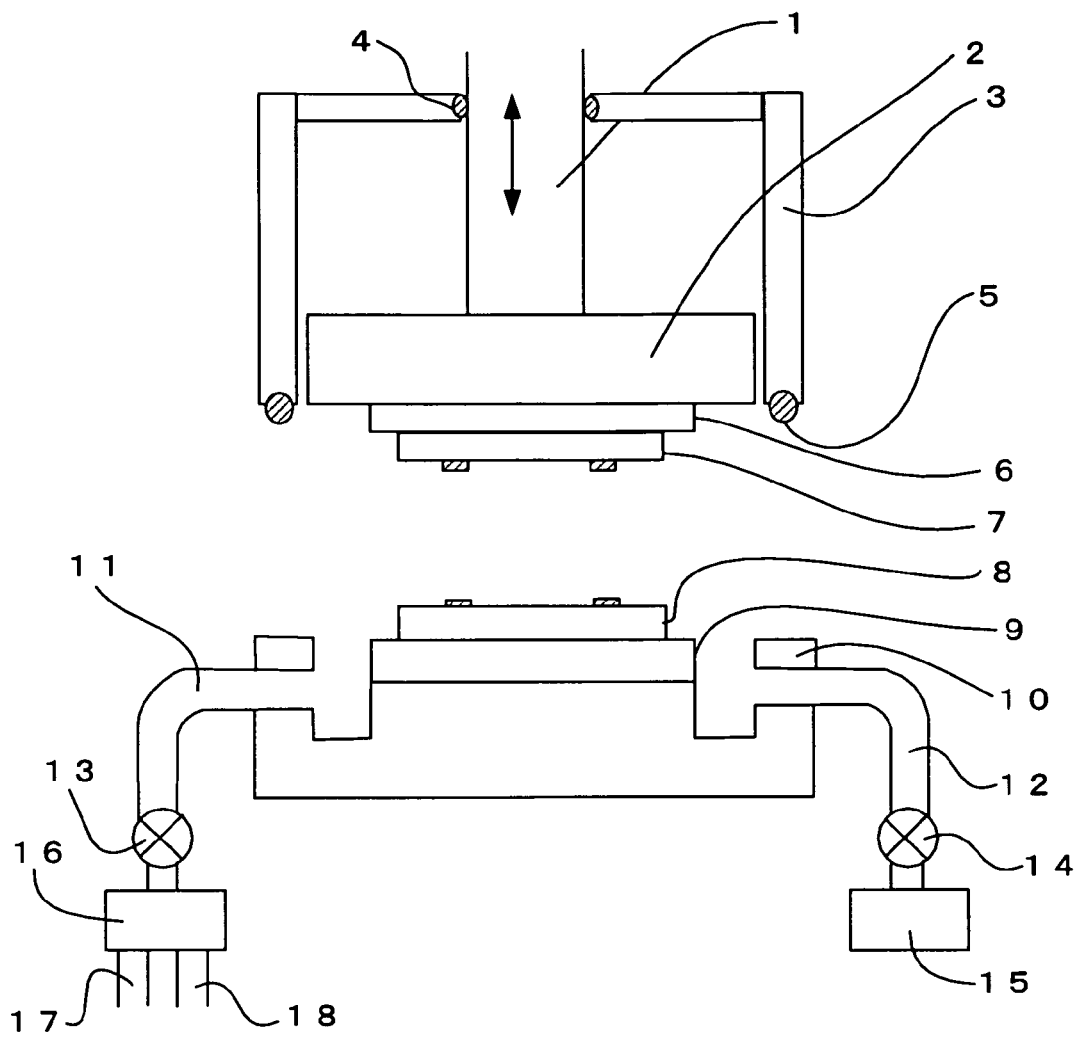
FIG. 1 is a schematic diagram illustrating a configuration of an apparatus according to a first embodiment of the present invention.

1 Z axis
2 piston type head
3 chamber wall
4 sliding packing
5 fixing packing
6 upper electrode
7 upper wafer
8 lower wafer
9 lower electrode
10 chamber support
11 inlet
12 outlet
13 intake valve
14 discharge valve
15 vacuum pump
16 gas switch valve
17 gas A
18 gas B
19 mark read transparent portion
20 alignment table
21 glass window
22 IR recognizing means
23 upper mark
24 lower mark
25 two-side recognizing means
26 prism
27 upper mark recognizing means
28 lower mark recognizing means
100 glass
101 silicon
201 torque control lifting/lowering drive motor
202 Z-axis lifting/lowering mechanism
203 O-axis rotation mechanism
204 pressure detecting means
205 bellows
206 XY alignment table
207 head
208 stage
209 lower wafer
210 upper wafer
211 vacuum chamber
212 head's recognizing means
213 stage's recognizing means
214 glass window
215 gas discharge pipe
216 gas discharge valve
217 vacuum pump
218 gas intake pipe
219 gas intake valve
220 intake gas switch valve
221 Ar
222 $O_2$
223 atmospheric air
227 upper alignment mark
228 lower alignment mark
229 slide moving means

BEST MODE FOR CARRYING OUT THE INVENTION

In this embodiment, a method and a bonding device are provided in which wafers (objects to be bonded) are surface-activated using a plasma, preliminary bonding is performed, and anodic bonding is performed in a separate main bonding step. Hereinafter, a desired embodiment of the present invention will be described with reference to the accompanying drawings. FIG. 7 illustrates a configuration according to an embodiment of the present invention in which preliminary bonding due to surface activation and main bonding due to anodic bonding are separated, thereby increasing production efficiency.

As illustrated in FIG. 7, bonding surfaces are surface-activated using a plasma treatment device A (energy wave treatment device), room temperature preliminary bonding is performed in a vacuum using a preliminary bonding device B, and main bonding with heating is performed in the atmospheric air using a plurality of main bonding devices C (three in FIG. 7), which are used in balance, thereby increasing production efficiency.

The plasma treatment device A and the preliminary bonding device B can be configured using the same device. FIG. 1 illustrates a wafer bonding device according to an embodiment of the present invention in which the plasma treatment device A and the preliminary bonding device B are the same device, and a wafer made of glass and a wafer made of Si are processed up to preliminary bonding or anodic bonding (main bonding) in this device. In this embodiment, while the glass wafer (upper object to be bonded) and the Si wafer (lower object to be bonded) are vertically held, facing each other, a chamber is closed, etching is performed in a vacuum using an Ar plasma, and thereafter, both the objects to be bonded are contacted and bonded together. When the process is performed up to the main bonding, a voltage is applied to perform the anodic bonding, and in some cases, the glass is softened by heating, so that a bonding area is increased, thereby increasing a strength.

As illustrated in FIG. 1, a configuration of the device is divided into a head section which holds an upper wafer 7 made of glass and performs a lifting/lowering control and a pressing control using a Z axis 1, and a stage section which holds a lower wafer 8 made of Si, and in some times, aligns a wafer. A pressure detecting means is incorporated into the Z axis 1, and performs a pressing force control by performing feedback with respect to a torque control of a Z-axis servo motor. Separately, a chamber wall 3 which can be lifted and lowered is lowered by an actuator, and is contacted via a fixing packing 5 to a chamber support 10. In this situation, the chamber is evacuated, a reaction gas is introduced, a plasma treatment is performed, the head section is lowered to contact and press both the wafers together, and an anode electrode is switched on to apply a voltage to perform anodic bonding. The chamber wall 3 is sealed using an O ring in a manner which allows the chamber wall to be lifted and lowered, or alternatively may be received at a place where a shaft is narrowed or at an outer circumference of a piston. In some cases, an upper electrode 6 and a lower electrode 9 may be provided with a heating heater which can perform heating during bonding.

Figure 2A:
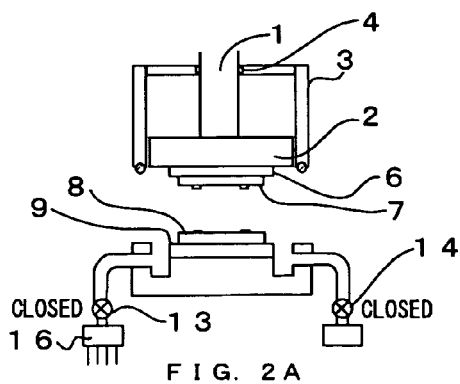
FIGS. 2A to 2H are diagrams illustrating an actual bonding process according to an embodiment.
Figure 2B:
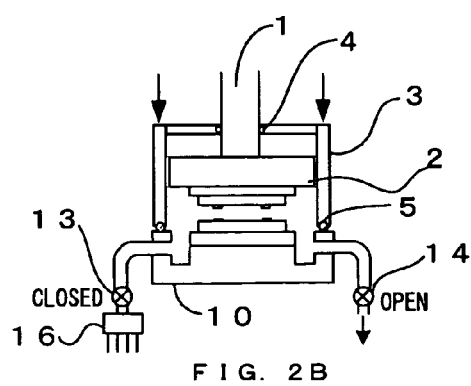

FIGS. 2A to 2H illustrates an example in which a plasma treatment to anodic bonding (main bonding) are continuously performed in a single device. An operation will be described in sequence. As illustrated in FIG. 2A, while the chamber wall 3 is in the lifted state, the upper wafer 7 made of glass is held by the upper electrode 6. Following this, the lower wafer 8 made of Si is held by the lower electrode 9. The holding method may be a mechanical chuck method, or desirably an electrostatic chuck method. Following this, as illustrated in FIG. 2B, the chamber wall 3 is lowered to contact the chamber support 10 via the fixing packing 5. The chamber wall 3 is sealed from the atmospheric air by a sliding packing 4. Therefore, by opening a discharge valve 14 while an intake valve 13 is closed, the chamber is evacuated using a vacuum pump 15, thereby making it possible to increase the degree of vacuum in the chamber.

Figure 2C:
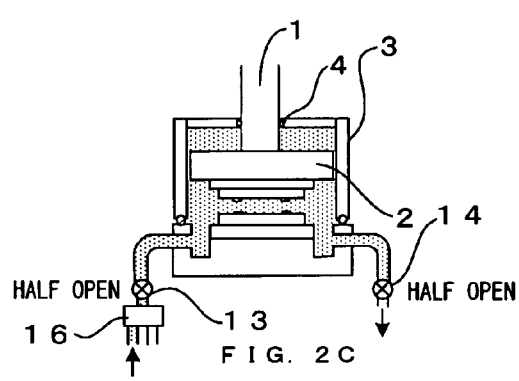
Figure 2D:
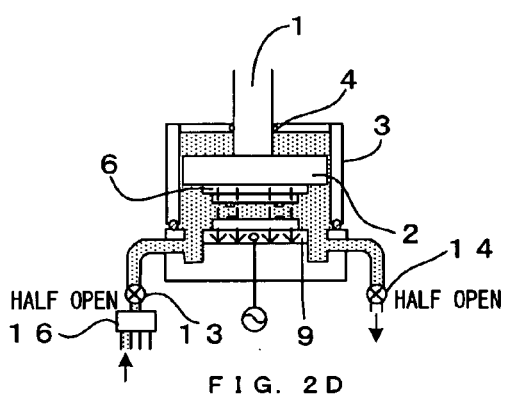
Figure 2E:
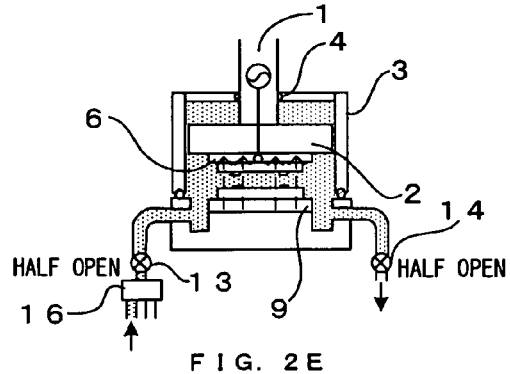

Next, as illustrated in FIG. 2C, the chamber is filled with a reaction gas made of Ar. By controlling a discharge amount at the discharge valve 14 and a gas intake amount at the intake valve 13 while the vacuum pump 15 is being operated, the chamber can be filled with the reaction gas while keeping a certain degree of vacuum. As illustrated in FIGS. 2D and 2E, in this embodiment, the chamber is initially filled with an Ar gas, and an alternating power supply plasma voltage is applied to the lower electrode 9, where the degree of vacuum is about $10^{-2}$ TORR, thereby generating a plasma and etching and cleaning a surface of the lower wafer 8 with the Ar plasma. Following this, by applying a similar alternating power supply to the upper electrode 6, the upper wafer is etched and cleaned with the Ar plasma. Next, as illustrated in FIG. 2B, the chamber is evacuated to discharge Ar. In some cases, by performing evacuation while heating both the electrodes at about 100° C., Ar which adheres to a surface or is implanted into a part is discharged.

Figure 2F:
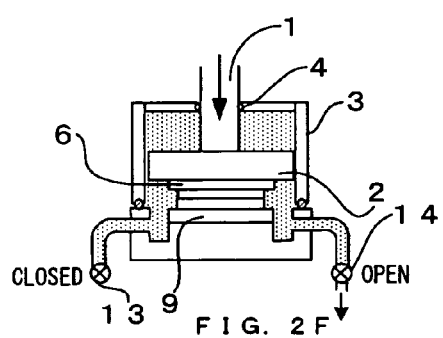

Following this, as illustrated in FIG. 2F, the piston type head 2 is lowered by the Z axis 1 while the chamber wall 3 and the Z axis 1 contact each other via the sliding packing 4 in a vacuum, so that both the wafers are caused to contact each other in a vacuum. An anode power supply voltage is applied between the upper electrode 6 (cathode) holding the upper wafer 7 made of glass, and the lower electrode 9, to create covalent bond (Si—O, etc.) at bonding interface, thereby performing anodic bonding. The inside of the chamber is blocked from an external atmosphere by the sliding packing 4 between the chamber wall 3 and the Z axis 1, whereby the piston type head section can be lowered while being held in a vacuum. In some cases, the wafers are simultaneously heated to 200° C. to 400° C. by the heaters included in both the electrodes, thereby increasing a strength.

Figure 2G:
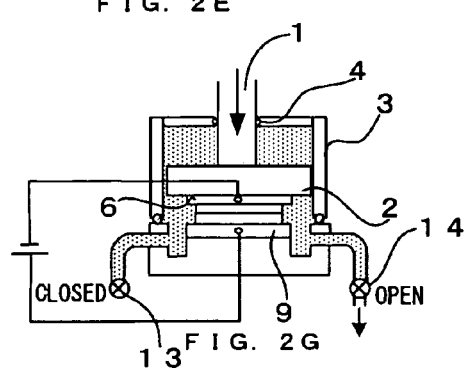
Figure 2H:
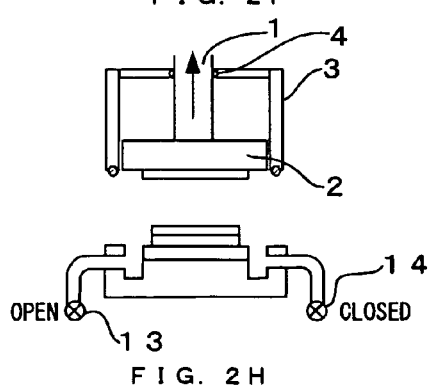

Thereafter, as illustrated in FIG. 2H, the atmospheric air is supplied into the chamber so that the pressure of the chamber is put back to the atmospheric pressure, the head section is lifted, and both the bonded wafers are removed out. In the case of a method of changing two gases (Ar and the atmospheric air, nitrogen, oxygen or the like) in a single chamber, Ar and the atmospheric gas can be selected and supplied using a gas switch valve 16. After Ar is initially selected to fill the chamber, the intake valve 13 is closed to evacuate the chamber to discharge Ar. Thereafter, the gas switch valve 16 is switched to the atmospheric air, and the intake valve 13 is opened to fill the chamber with the atmospheric air. When the chamber is opened, the chamber can be released to the atmospheric air.

Figure 3:
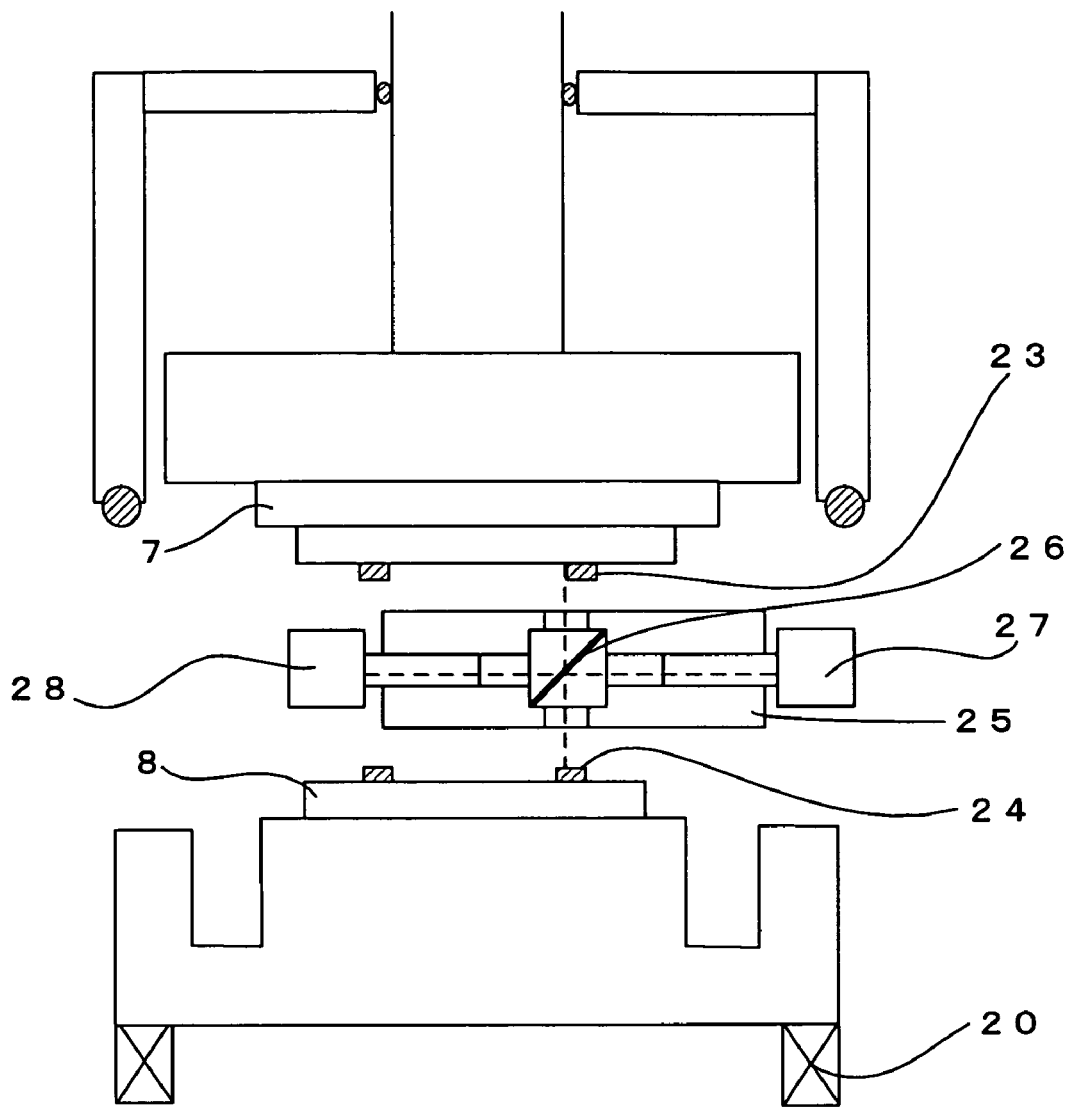
FIG. 3 is an alignment configuration diagram in which a two-side recognizing means is used in the atmospheric air.

In some cases, when bonding the wafers, both the wafers 7 and 8 may be bonded together after the positions of the wafers are aligned. FIG. 3 illustrates a method of performing alignment before evacuation. Upper alignment marks 23 are attached to two portions of the upper wafer 7, and lower alignment marks 24 are attached to two similar portions of the lower wafer 8. A two-side recognizing means 25 is inserted between both the wafers 7 and 8, and the upper and lower mark positions are read using the recognizing means 25. The two-side recognizing means 25 splits upper and lower mark images using a prism 26, so that the upper and lower mark images are separately read by an upper mark recognizing means 27 and a lower mark recognizing means 28. Note that the two-side recognizing means 25 is moved using a table having the X and Y axes and, in some cases, the Z axis, thereby making it possible to read a mark at any arbitrary position. Thereafter, the position of the lower wafer 8 is corrected and shifted to the position of the upper wafer 7 using an alignment table 20. After shifting, the two-side recognizing means 25 can be inserted again to repeat correction, thereby improving accuracy.

Figure 4:
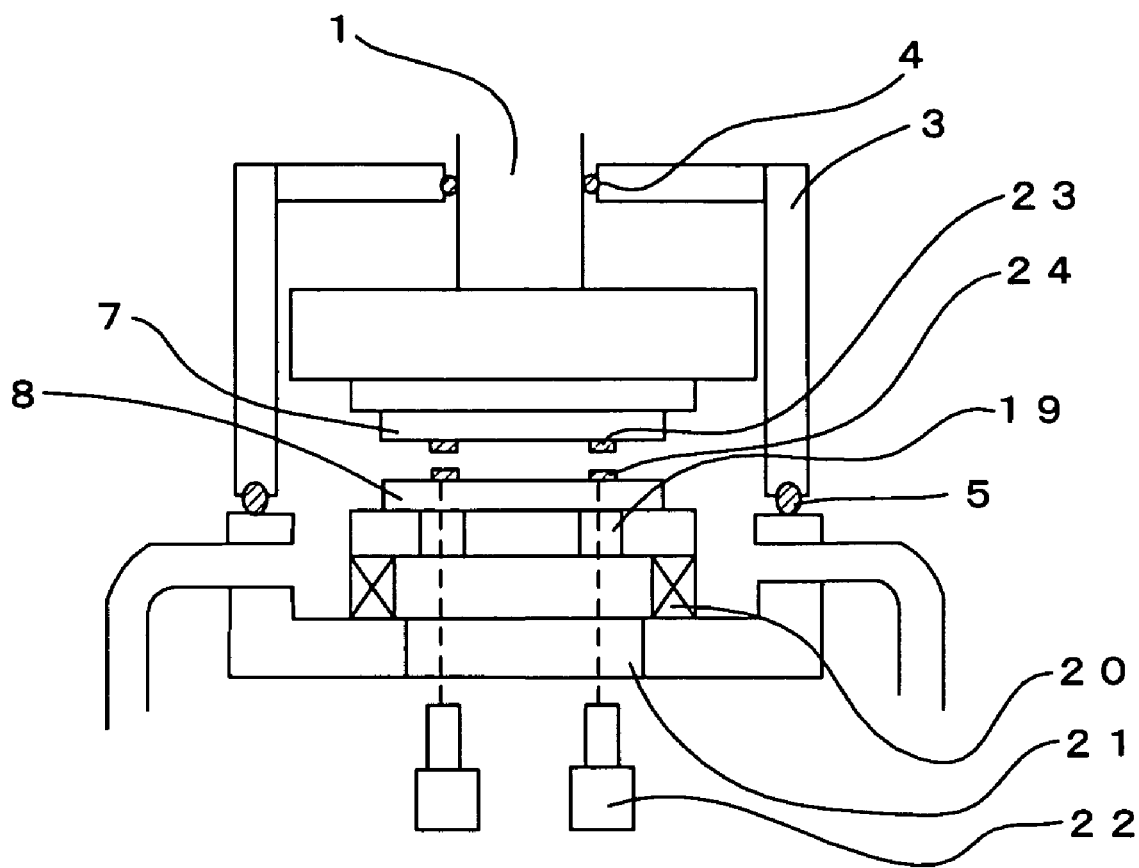
FIG. 4 is an alignment configuration diagram in which an IR recognizing means is used in a vacuum.
Figure 5:
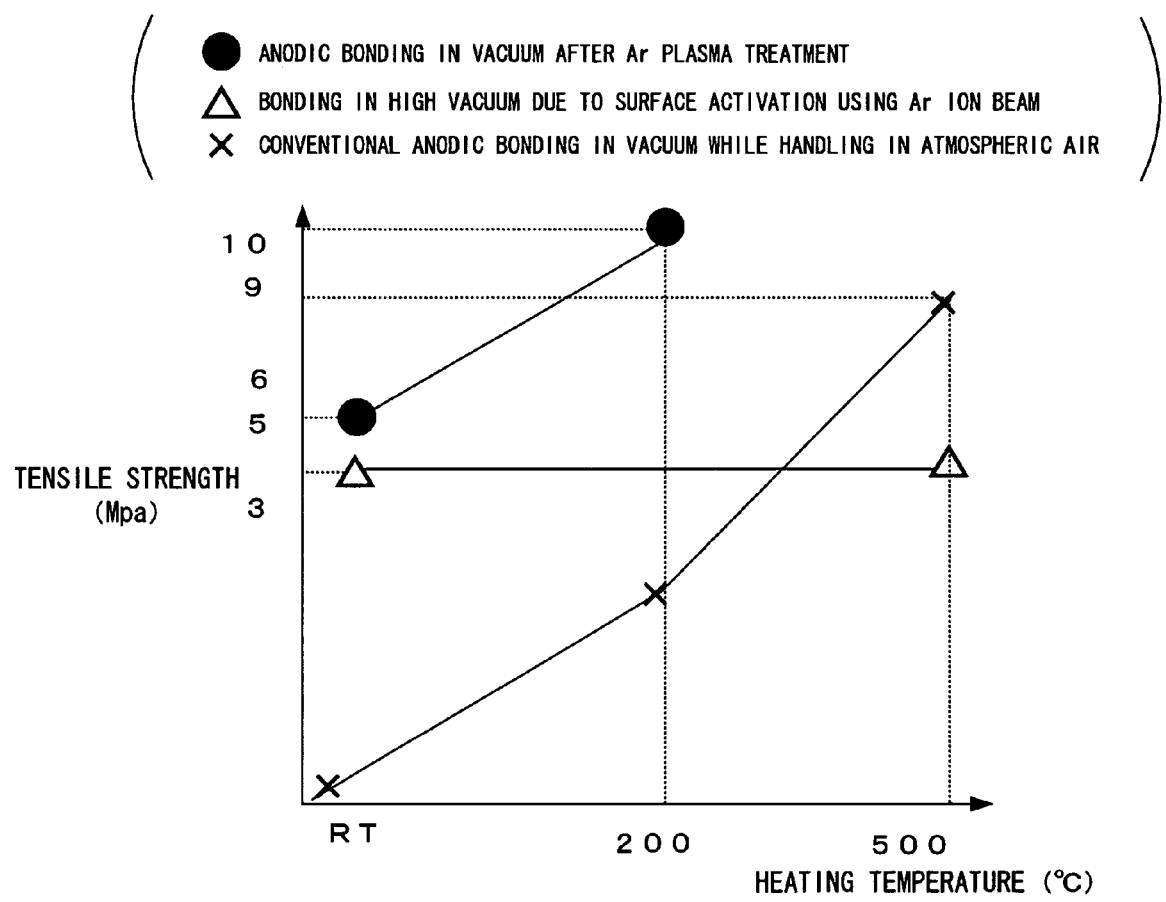
FIG. 5 is a graph for comparison between after a conventional technique and after an Ar plasma treatment.
Figure 6:
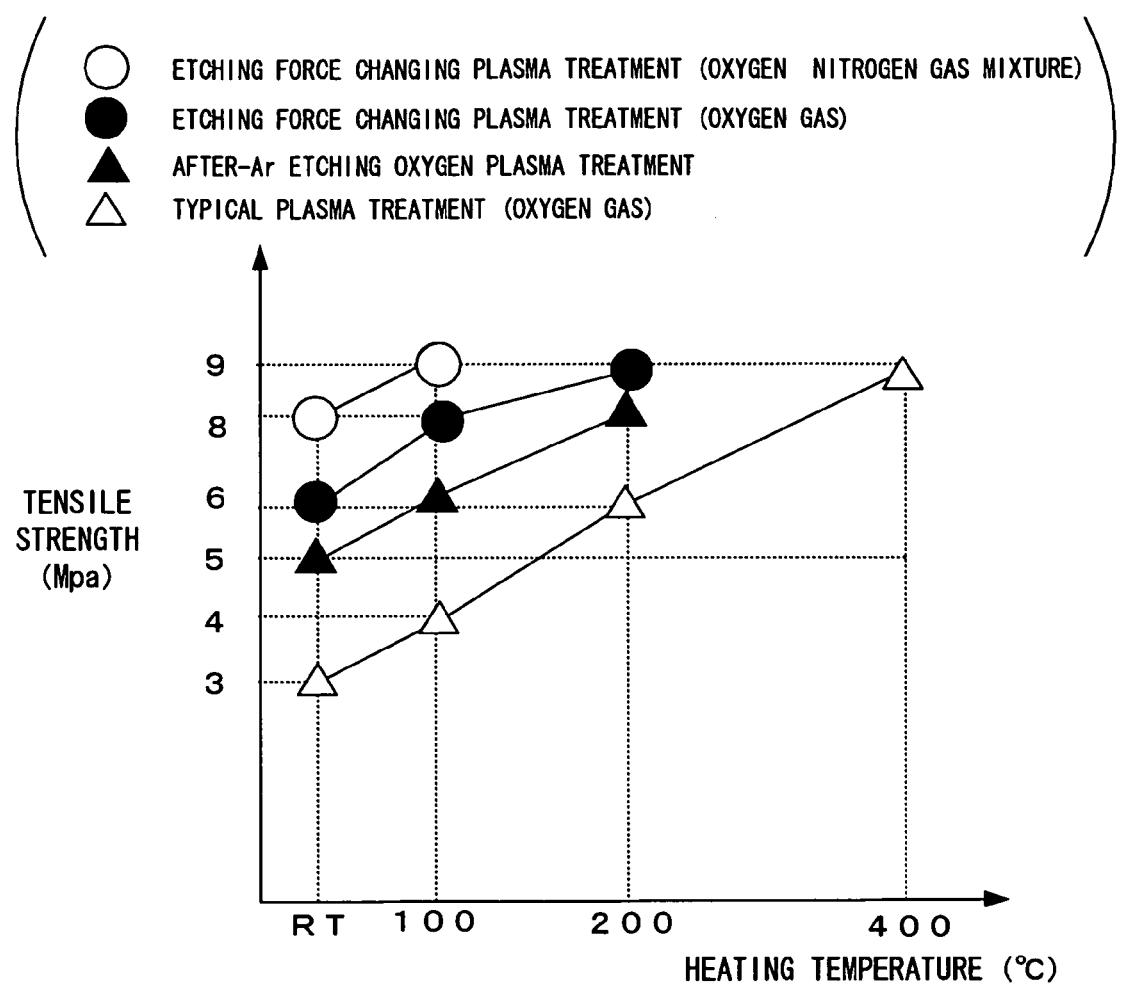
FIG. 6 is a graph for comparison regarding bonding.
Figure 8A:
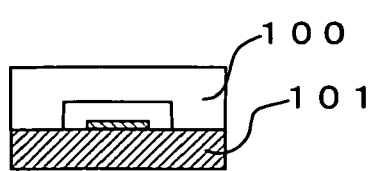
FIGS. 8A and 8B are diagrams illustrating a device with sealing.
Figure 8B:
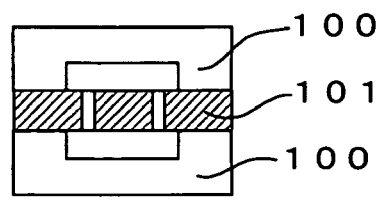

FIG. 4 illustrates a method capable of performing alignment even before bonding is performed after evacuation. When both the objects to be bonded need to be aligned with high accuracy, alignment needs to be performed after the plasma treatment step. This is because heat generation in the plasma treatment causes thermal expansion of the objects to be bonded or the object-to-be-bonded holding means, resulting in a position error thereof. By recognizing positions of both the objects to be bonded using the recognizing means after the plasma treatment, followed by alignment, bonding can be achieved with high accuracy of several micrometers or less without a position error.

The means for translating and/or rotating an object to be bonded for alignment is preferably provided in the vacuum chamber in view of accuracy. The recognizing means (an optical system or an imaging element) for recognizing positions of both the objects to be bonded is preferably provided outside the chamber by providing a glass window to the chamber. Most optical systems or imaging elements cannot be used in a vacuum, and are preferably provided in the outside atmospheric air so as to maintain accuracy. It is difficult for the moving means for alignment to perform a minute movement by an external operation, and is preferably provided in the chamber so as to achieve high accuracy. The plasma treatment step, the alignment step and/or the preliminary bonding step can be performed in separate chambers, and the chambers can be linked into a cluster structure using a transporting means in a vacuum, however, the resultant device is complicated and expensive.

This can be continuously performed in a single chamber by using the device configuration of FIG. 1 and the alignment method of FIG. 4, resulting in a compact device and a reduction in cost. Also, by the continuous process, adhering substances can be suppressed to a minimum level. Upper alignment marks 23 are attached to two portions of the upper wafer 7, and lower alignment marks 24 are attached to two portions of the lower wafer 8. The upper and lower marks have shapes which can be recognized in the same visual field even if they overlap each other. After a plasma treatment, both the wafers are placed close to each other, and the upper and lower alignment marks formed of a metal are simultaneously recognized and the positions thereof are read by an IR (infrared) recognizing means 22, where a mark read transparent portion 19, a glass window 21, and the lower wafer are transparent with respect to the upper and lower alignment marks. When a correct depth of focus is not obtained, reading may be performed by moving the IR recognizing means 22 vertically.

The IR recognizing means 22 may be moved using a table having the X and Y axes and, in some cases, the Z axis so as to read the marks at any arbitrary positions. Thereafter, the position of the lower wafer 8 may be corrected and shifted to the position of the upper wafer 7 using an alignment table 20. After shifting, the IR recognizing means 22 can be used again to repeat correction, thereby improving accuracy. The IR reorganization technique can be applied to bonding of Si objects. Also, when glass is held at the lower position and Si is held at the upper position, alignment can be performed using visible light. As a method of performing bonding after replacement with a gas containing $H_2O$ or H and OH groups after the oxygen plasma treatment, a method of using a water gas is easy. Alternatively, an H₂O molecular beam, a hydrogen gas or the like can be used.

Etching is preferably performed using an Ar plasma in view of efficiency, however, etching may be performed using other gases, such as nitrogen, oxygen and the like in the present invention. Particularly, when preliminary bonding is performed using a hydrophilic treatment, an oxygen or nitrogen plasma is used to provide OH groups on a bonding surface, thereby performing surface activation, and both wafers are contacted with each other, leading to hydrogen bond. If heating is performed as well, eutectic bond is obtained, resulting in an increase in strength. Also, if this device is used as a preliminary bonding device, and after preliminary bonding is performed by surface activation, anodic bonding (main bonding) is performed in a separate step or device, production efficiency can be increased and bonding of a three-layer structure free from occurrence of a warp can be achieved. In addition to the above-described flow, a description will be given. After the Ar plasma treatment, the steps of FIGS. 2C to 2D are performed, where an oxygen gas is supplied instead of Ar, thereby subjecting the surface to an oxygen plasma treatment. A method of changing two gases (Ar and oxygen) in a single chamber, can select and supply Ar and oxygen (O₂) gases using the gas switch valve 16. After Ar is initially selected to fill the chamber, the intake valve 13 is closed to evacuate the chamber to discharge Ar. Thereafter, the gas switch valve 16 is switched to an oxygen gas, and the intake valve 13 is opened to fill the chamber with an oxygen gas. The gas switch valve 16 can take the atmospheric air in. Therefore, when the chamber is opened, the chamber can be released to the atmospheric air. Next, a water gas is supplied, and in some cases, is used to perform a plasma treatment, thereby subjecting a surface to a hydrophilic treatment.

Following this, as illustrated in FIG. 2F, the piston type head 2 is lowered by the Z axis 1 while the chamber wall 3 and the Z axis 1 contact each other via the sliding packing 4 in a vacuum, so that both the wafers are caused to contact each other in a vacuum, thereby performing preliminary bonding of the wafers due to a hydrogen bonding force. When the device is used as a device for collectively performing preliminary bonding (contacting and pressing) and main bonding (contacting and pressing), heating is performed while a voltage is applied between both the electrodes 6 and 9 as illustrated in FIG. 2G, thereby performing anodic bonding. The inside of the chamber is blocked from an external atmosphere by the sliding packing 4 between the chamber wall 3 and the Z axis 1, whereby the piston type head section can be lowered while being held in a vacuum. In some cases, the wafers are simultaneously heated by the heaters included in both the electrodes, thereby increasing the strength. Thereafter, as illustrated in FIG. 2H, the atmospheric air is supplied into the chamber so that the pressure of the chamber is put back to the atmospheric pressure, the head section is lifted, and the bonded wafers 7 and 8 are removed out.

In the configuration in which the IR recognizing means 22 reads a mark, a passage of an IR light source in space or the like between the mark read transparent portion 19, the glass window 21, and the alignment table is not limited to space and glass, and may be formed of a material which transmits IR light. Instead of reflected light, transmitting light may be used, where a light source is provided on the opposite side of the IR recognizing means 22.

As the plasma treatment method, the wafer held on the alternating electrode surface is preferably cleaned in view of efficiency, however, the electrode may be placed at a position other than the wafer and the wafer may be cleaned in view of uniformity or a reduction in damage.

Figure 11:
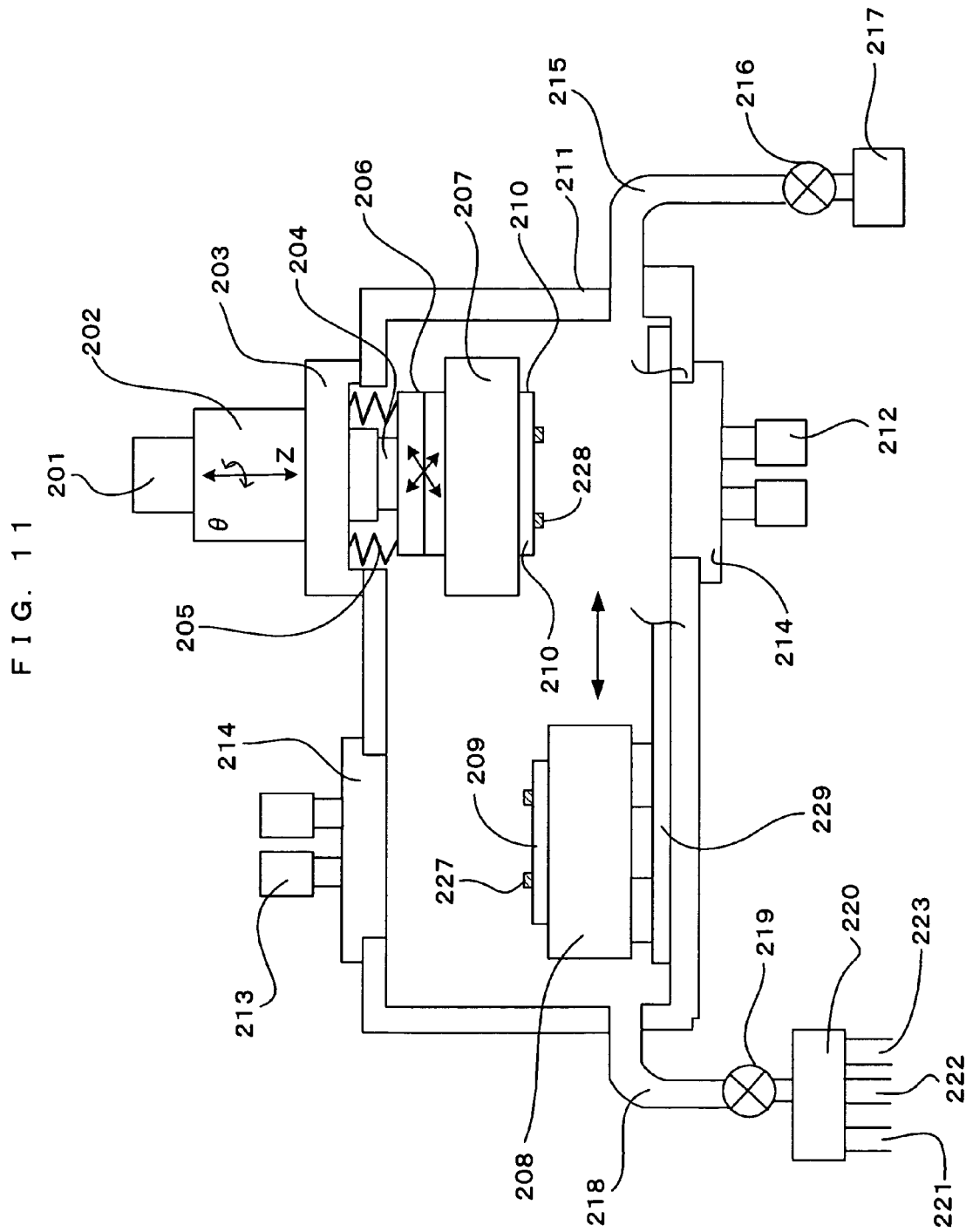
FIG. 11 is a diagram illustrating a stage-slide type preliminary bonding device.
Figure 12:
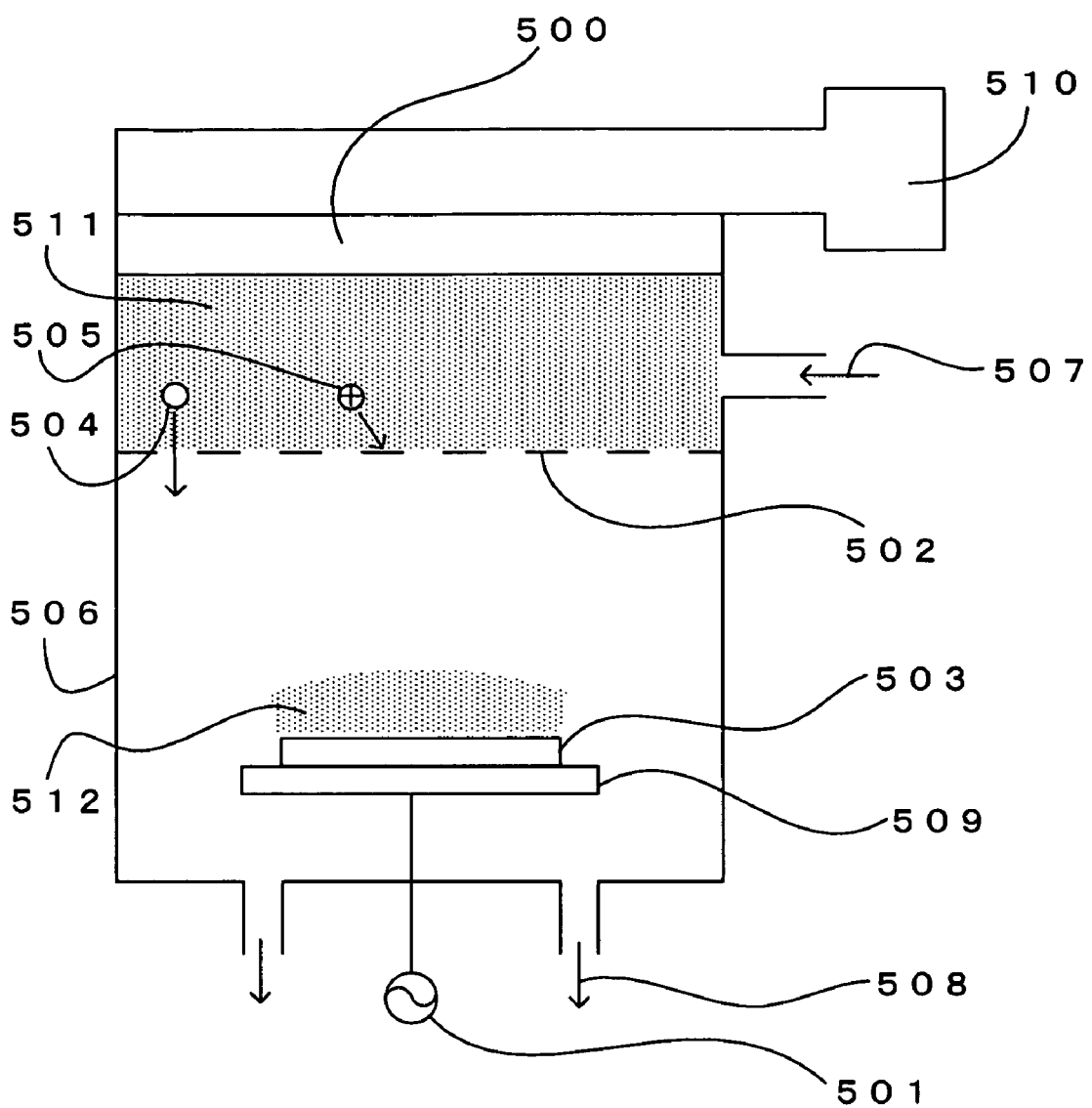
FIG. 12 is a schematic diagram illustrating a variation of the device.

Next, a preliminary bonding device in which a plasma treatment is not performed where wafers are positioned facing each other, but is performed where the wafers are slid with respect to each other, is illustrated in FIG. 11. The preliminary bonding device is configured as illustrated in FIG. 11 so that a head 207 which holds an upper wafer 210 and a stage 208 which holds a lower wafer 209 are provided in a vacuum chamber 211, the head 207 comprises a Z-axis lifting/lowering mechanism 202 to which a torque control lifting/lowering drive motor 201 is linked, a Ο-axis rotation mechanism 203 which rotates the Z-axis lifting/lowering mechanism 202, and an XY alignment table 206 which moves and aligns the head 207 in X and Y horizontal directions. A pressing force detected by a pressure detecting means 204 during bonding is fed back to the torque control lifting/lowering drive motor 201, thereby switching between a position control and a pressing force control. The XY alignment table 206 can use a means which can be used in a vacuum. Since the Z- and θ-axis mechanisms are placed outside the vacuum chamber, the head section is blocked from the outside via a bellows 205 in a manner which allows the head section to move.

The stage 208 can be slid between a bonding position and a standby position by a slide moving means 229. A linear scale for high-accuracy guidance and position recognition is attached to the slide moving means 229, so that a stop position between the bonding position and the standby position can be maintained with high accuracy. The slide moving means 229 may have any configuration.

Although the object-to-be-bonded holding means of the head 207 and the stage 208 may be of a mechanical chucking type, an electrostatic chuck is preferably provided. The object-to-be-bonded holding means also comprises a heating heater, and also serves as a plasma electrode, i.e., has three functions: holding means; heating means; and plasma generating means.

Regarding a decompressing means, a vacuum pump 217 is coupled with a gas discharge pipe 215, and a gas discharge valve 216 is opened or closed so as to control a flow rate, so that the degree of vacuum can be controlled. Regarding an intake portion, an intake gas switch valve 220 is linked to a gas intake pipe 218, and a gas intake valve 219 is opened or closed so as to control a flow rate. Regarding intake gas, two plasma reaction gases can be linked. For example, Ar 221 and oxygen (O₂) 222 can be linked. Mixed gases having different mixture ratios can be linked. As the other one, the atmospheric air 223 for atmospheric-pressure release or nitrogen containing water molecules is linked. The degree of vacuum including the atmospheric pressure and the reaction gas concentration can be controlled to be optimum values by a control of a flow rate, including opening or closing of the gas intake valve 219 and the gas discharge valve 216.

Alignment mark recognizing means (a stages' recognizing means 213 and a head's recognizing means 212) comprising an optical system for alignment are provided outside the vacuum chamber 211 above the stage standby position and below the head, respectively. Regarding the recognizing means, at least one needs to be provided for the stage and at least one needs to be provided for the head. Assuming that a small object, such as a chip, is recognized, if alignment marks 227 and 228 have a shape whose θ-direction component can be read or two marks are provided in one visual field, a single recognizing means is sufficient to read. The recognizing means may comprise a camera having an optical lens for visible light or IR (infrared) light, for example.

The vacuum chamber 211 is provided with a glass window 214 formed of a material which is transparent with respect to the optical system of the recognizing means, such as glass. The alignment marks 227 and 228 on the objects to be bonded in the vacuum chamber 211 is recognized via the window. When fine alignment is performed with nano-level high accuracy, rough positioning is performed, and thereafter, while the upper wafer 210 and the lower wafer 209 are close to each other at a distance of about several micrometers, a visible light/IR (infrared) recognizing means is used as the head's recognizing means 212, and a transparent hole or a transparent material is provided at an alignment mark position of the stage, so that the alignment marks on both the wafers are simultaneously recognized through the transparent stage from the bottom, whereby alignment can be achieved again in the X, Y, and θ directions.

With such a preliminary bonding device, by performing a plasma treatment while the upper wafer 210 and the lower wafer 209 are slid with respect to each other, it is possible to prevent etched matter from readhering to a counter wafer, and by using a surface facing a wafer as an electrode, it is possible to reduce an etching force so as to increase a chemical treatment, thereby making it possible to facilitate adhesion of OH groups. After the plasma treatment, the lower stage is slid to a position where the lower stage faces the upper wafer, and a bonding treatment similar to that which is described above is performed.

When the energy wave treatment employs an ion beam or an atom beam other than a plasma, two beam emitting devices are attached to the device of FIG. 11, and are slid so that wafer surfaces are separately irradiated from slanting directions.

When the energy wave treatment, such as a plasma or the like, is performed using a dedicated device, the above-described preliminary bonding device can exclude the energy wave treatment.

Next, the main bonding device will be described. Since vacuum sealing or gas sealing has already been done in the preliminary bonding device, the main bonding device may be a simple device in which only applying a voltage and heating are performed in the atmospheric air. The main bonding device can be used as an anodic bonding device so that applying a voltage and heating are performed to soften glass, thereby burying gaps caused by sandwiched dust or unevenness or wave-like form of a material. Therefore, a bonding area is increased, resulting in an increase in strength. By arranging a plurality of such main bonding devices C as illustrated in FIG. 7, production efficiency can be increased, so that cost can be reduced.

Figure 9A:
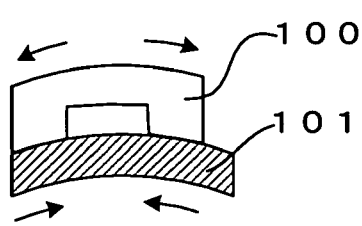
FIGS. 9A and 9B are diagrams illustrating a warp due to heating.
Figure 9B:
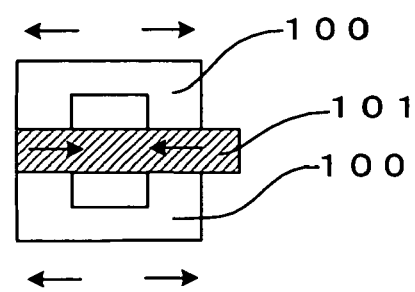
Figure 10A:
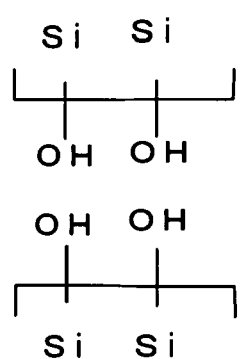
FIGS. 10A to 10C are diagrams illustrating bonding chemical formulas due to a hydrophilic treatment.
Figure 10B:
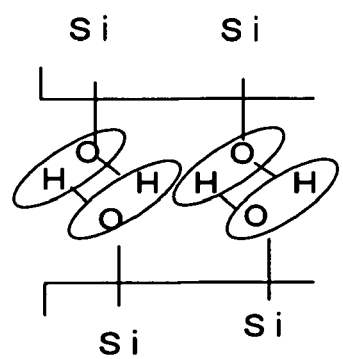
Figure 10C:
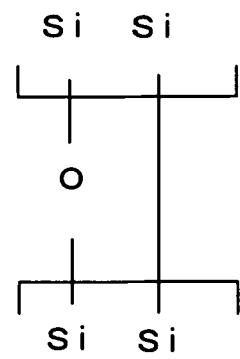

As illustrated in FIG. 9B, three or more members are sandwiched from both sides which are made of the materials having the same coefficient of linear expansion, thereby obtaining high position accuracy, followed by room temperature preliminary bonding, and then main bonding with heating, thereby making it possible to perform bonding with high accuracy.

In the plasma treatment step, by performing a plasma treatment using a reduced etching force in the second half of the plasma treatment, a hydrophilic treatment is satisfactorily performed. Impurities are removed by a physical treatment in a typical plasma treatment, and attachment and arrangement of OH groups and replacement with nitrogen or the like are performed on a surface using a chemical treatment, however, the OH groups caused by the chemical treatment of the surface are unfortunately removed due to the strong etching force, thereby making it difficult to uniformly perform the chemical treatment on the surface.

Therefore, in the second half of the plasma treatment, the etching force is reduced to perform a plasma treatment. In this case, there are a number of ions or radicals which are not accelerated, whereby a chemical reaction is promoted and the chemical treatment is uniformly performed on the bonding surface, thereby making it possible to perform a surface activation treatment. Therefore, the bonding strength can be increased at low temperature, and also, preliminary bonding can be easily performed. The etching force can be changed by changing a Vdc value of a plasma, changing a pulse width, or using a surface facing a wafer as an electrode.

INDUSTRIAL APPLICABILITY

Note that the present invention is not limited to the above-described embodiments, and various changes can be made without departing the spirit and scope of the present invention. The present invention can be applied to a variety of bonding of a plurality of objects to be bonded, such as a wafer and the like, and is particularly suitable for MEMS devices.

The invention claimed is:

1. A bonding method which comprises performing anodic bonding of objects to be bonded after subjecting bonding surfaces of both the objects to be bonded to a surface activation treatment using a plasma, wherein the surface activation treatment causes OH groups to covalently adhere to the bonding surfaces, wherein the anodic bonding of the objects causes $H_2O$ to be released and covalent bonds to be formed between the bonding surfaces, and wherein both the objects to be bonded are heated at less than 400° C. during or after bonding.

2. The bonding method according to claim 1, wherein both the objects to be bonded are heated at less than 400° C. to form the covalent bonds between the bonding surface.

3. The bonding method according to claim 1, wherein after said surface activation treatment, the anodic bonding of both the objects to be bonded is performed without exposure to the atmospheric air.

4. The bonding method according to claim 3, wherein said plasma is a low-pressure plasma, and continuously after said surface activation treatment, the objects to be bonded are contacted with each other in a vacuum in the same chamber used to perform the anodic bonding.

5. The bonding method according to claim 1, wherein an amount of etching using said plasma is 1 nm or more.

6. The bonding method according to claim 1, wherein, after performing preliminary bonding due to surface activation at room temperature, main bonding due to the anodic bonding is performed in a separate step or device.

7. The bonding method according to claim 6, wherein a single step of performing said preliminary bonding is balanced with a plurality steps of performing said main bonding.

8. The bonding method according to claim 6, wherein three or more objects to be bonded are stacked and bonded together, and objects to be bonded having the same coefficient of linear expansion sandwich an object to be bonded having a different coefficient of linear expansion from both sides thereof.

9. The bonding method according to claim 6, wherein said preliminary bonding is performed in a low-pressure chamber under a low pressure or in a replacing gas, and said main bonding is performed in the atmospheric air.

10. The bonding method according to claim 6, wherein said plasma is a low-pressure plasma, and continuously after said surface activation treatment, the objects to be bonded are contacted with each other in a vacuum in the same chamber used to perform said preliminary bonding.

11. The bonding method according to claim 1, wherein, during or after said surface activation treatment using said plasma, said preliminary bonding is performed after introducing and mixing a gas containing $H_2O$ or H and OH groups.

12. The bonding method according to claim 1, wherein, in said surface activation treatment using said plasma, a physical treatment using an increased ion strike force is performed and thereafter, without exposure to the atmospheric air, a chemical treatment using a reduced ion strike force is performed.

13. The bonding method according to claim 12, wherein said physical treatment is performed using an Ar or $CF_4$ plasma.

14. The bonding method according to claim 12, wherein said chemical treatment is performed using an oxygen or nitrogen plasma.

15. The bonding method according to claim 1, wherein at least one of the objects to be bonded is made of Si or an oxide including glass, $SiO_2$ and ceramics.

16. A device, such as a semiconductor device, a MEMS device or the like, which is produced using the bonding method according to claim 1 and in which the object to be bonded is a wafer or a chip cut off from the wafer.

17. The bonding method according to claim 7, wherein said preliminary bonding is performed in a low pressure chamber under a low pressure or in a replacing gas, and said main bonding is performed in the atmospheric air.

18. The bonding method according to claim 8, wherein said preliminary bonding is performed in a low pressure chamber under a low pressure or in a replacing gas, and said main bonding is performed in the atmospheric air.

19. The bonding method according to claim 6, wherein, during or after said surface activation treatment using said plasma, said preliminary bonding is performed after introducing and mixing a gas containing $H_2O$ or H and OH groups.

20. The bonding method according to claim 6, wherein, in said surface activation treatment using said plasma, a physical treatment using an increased ion strike force is performed and thereafter, without exposure to the atmospheric air, a chemical treatment using a reduced ion strike force is performed.

21. The bonding method according to claim 6, wherein at least one of the objects to be bonded is made of Si or an oxide including glass, $SiO_2$ and ceramics.

22. A device, such as a semiconductor device, a MEMS device or the like, which is produced using the bonding method according to claim 6 and in which the object to be bonded is a wafer or a chip cut off from the wafer.

* * * * *

UNITED STATES PATENT AND TRADEMARK OFFICE
CERTIFICATE OF CORRECTION

PATENT NO.        : 7,645,681 B2                                           Page 1 of 1
APPLICATION NO.   : 10/581430
DATED             : January 12, 2010
INVENTOR(S)       : Masuaki Okada It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 553 days.

Signed and Sealed this

Twenty-eighth Day of December, 2010

David J. Kappos
*Director of the United States Patent and Trademark Office*